US009624597B2

(12) United States Patent
Ye

(10) Patent No.: US 9,624,597 B2
(45) Date of Patent: Apr. 18, 2017

(54) METHODS AND APPARATUSES FOR DELAMINATING PROCESS PIECES

(71) Applicant: Yan Ye, Saratoga, CA (US)

(72) Inventor: Yan Ye, Saratoga, CA (US)

(*) Notice: Subject to any disclaimer, the term of this patent is extended or adjusted under 35 U.S.C. 154(b) by 0 days.

(21) Appl. No.: 14/896,837

(22) PCT Filed: Jun. 6, 2014

(86) PCT No.: PCT/US2014/041205
§ 371 (c)(1),
(2) Date: Dec. 9, 2015

(87) PCT Pub. No.: WO2014/200827
PCT Pub. Date: Dec. 18, 2014

(65) Prior Publication Data
US 2016/0130717 A1 May 12, 2016

Related U.S. Application Data

(60) Provisional application No. 61/834,574, filed on Jun. 13, 2013.

(51) Int. Cl.
C25F 5/00 (2006.01)
H01L 21/3213 (2006.01)
(Continued)

(52) U.S. Cl.
CPC ............ *C25F 5/00* (2013.01); *C25F 7/00* (2013.01); *H01L 21/3213* (2013.01); *H01L 21/7806* (2013.01); *H01L 29/66765* (2013.01)

(58) Field of Classification Search
CPC ..... C25F 5/00; H01L 21/3213; H01L 21/7806
See application file for complete search history.

(56) References Cited

U.S. PATENT DOCUMENTS 5,344,517 A * 9/1994 Houlding .................. C25F 3/12
156/236
8,748,324 B1 * 6/2014 Woo .......................... C25F 5/00
204/242

(Continued)

FOREIGN PATENT DOCUMENTS

JP 2000223683 A 8/2000
JP 2009111373 A 5/2009
WO 2009048265 A1 4/2009

OTHER PUBLICATIONS

PCT/US2014/041205—Notification of Transmittal of the International Search Report and the Written Opinion of the International Searching Authority, or the Declaration, International Search Report, Written Opinion of the International Searching Authority, dated Oct. 15, 2014, 16 pages.

(Continued)

Primary Examiner — Nicholas A Smith
(74) Attorney, Agent, or Firm — Nolte & Associates PC

(57) ABSTRACT

Methods and apparatuses for delaminating workpieces are provided. In one or more aspects, a method can include processing or otherwise delaminating the workpiece by separating a delamination stack and a support substrate disposed thereon. The workpiece that can include a sacrificial layer disposed between the delamination stack and the support substrate. The method can include exposing at least a portion of the workpiece to an electrolyte solution, applying an electrical current through the sacrificial layer and the electrolyte solution, selectively removing the electrically conductive or semiconductive material from the sacrificial layer during an etching process, and separating the delamination stack and the support substrate one from the other. The delamination stack can include a process piece that can be one or more wafers or devices (e.g., thin-film devices) or one or more portions of the one or more wafers or devices.

18 Claims, 14 Drawing Sheets

(51) Int. Cl.
*H01L 21/78* (2006.01)
*H01L 29/66* (2006.01)
*C25F 7/00* (2006.01)

(56) References Cited

U.S. PATENT DOCUMENTS

| | | |
|---|---|---|
| 2002/0071915 A1 | 6/2002 | Schubert et al. |
| 2007/0026662 A1 | 2/2007 | Kawano et al. |
| 2009/0321881 A1 | 12/2009 | Archer et al. |
| 2009/0321885 A1 | 12/2009 | Archer et al. |
| 2009/0321886 A1 | 12/2009 | Gmitter et al. |
| 2010/0001316 A1 | 1/2010 | Gmitter et al. |
| 2010/0001374 A1 | 1/2010 | Gmitter et al. |
| 2010/0116784 A1 | 5/2010 | Archer |
| 2010/0147370 A1 | 6/2010 | He et al. |
| 2010/0151689 A1 | 6/2010 | Gmitter et al. |
| 2010/0219509 A1 | 9/2010 | He et al. |
| 2011/0214805 A1 | 9/2011 | Brown et al. |
| 2013/0029447 A1 | 1/2013 | Maruyama et al. |

OTHER PUBLICATIONS

PCT/US14/41205—Notification of Transmittal of International Preliminary Report on Patentability, International Preliminary Report on Patentability, dated Jun. 10, 2015, 22 pages.

\* cited by examiner

METHODS AND APPARATUSES FOR DELAMINATING PROCESS PIECES

CROSS-REFERENCE TO RELATED APPLICATION

This application is a United States national stage application of PCT Patent Application No. PCT/US2014/041205, entitled "Methods and Apparatuses for Delaminating Process Pieces", filed Jun. 6, 2014, which claims benefit of U.S. Prov. Appl. No. 61/834,574, entitled "Method and Apparatus for Converting a Conductive Layer on a Workpiece," filed on Jun. 13, 2013. The aforementioned patent applications are hereby incorporated by reference in their entirety into the present application to the extent not inconsistent with the present disclosure.

BACKGROUND

Field

Embodiments generally relate to methods and apparatuses for delaminating a workpiece by separating a delamination stack and a support substrate.

Description of the Related Art

One phase in electronic device fabrication involves handling and packaging of thin-films used in semiconductor devices, display devices, energy storage devices, solar devices, or other electronic devices. Such devices may be manufactured by utilizing a variety of processes for depositing and removing materials onto a wafer or other substrate.

Electrochemical processes and apparatus have been utilized for patterning, cleaning, and polishing, materials used in semiconductor devices, display devices, and other electronic devices. Electrochemical etching processes have been used to micromachine three-dimensional structures in substrates containing both n-type and p-type silicon regions, to produce porous silicon, and to introduce pores on the surface of silicon substrates. In addition, electropolishing and electrochemical mechanical polishing (ECMP) techniques have been utilized to polish metallic surfaces on substrates by applying an electrochemical potential between the substrate and an electrode in contact with a polishing pad and a chemical reagent.

However, electrochemical techniques have not been fully utilized to process thin-film materials. Generally, the concentrated acids and bases, the high electrical power, and the typical rough handling of substrates in the typical electrochemical process is not conducive to manufacture thin-film materials. Thin-films are generally very difficult to manage or handle, such as when bonding to a substrate or while packaging, since the thin-films are very fragile. The thin-films crack under very small forces. Also, the thin-films are very difficult to move due to their extremely narrow dimensions. The etching process utilized on thin-film materials must be fast in order to obtain high throughput of the overall fabrication process, as well as to reduce the duration in which the thin-film is under undue strain or force.

Therefore, there is a need for improved and efficient methods for delaminating workpieces and apparatuses for delaminating such workpieces by separating a delamination stack from a support substrate so to increase productivity and reduce processing costs.

SUMMARY

Embodiments of the disclosure generally provide methods for delaminating workpieces, such as separating a delamination stack from a support substrate, and apparatuses for delaminating the workpieces. In one or more exemplary embodiments, a method can include processing or otherwise delaminating a workpiece by separating a delamination stack and a support substrate disposed on the workpiece that can include a sacrificial layer disposed between the delamination stack and the support substrate. The method can include exposing at least a portion of the workpiece to an electrolyte solution, applying an electrical current through the sacrificial layer and the electrolyte solution, selectively removing the electrically conductive material or the electrically semiconductive material from the sacrificial layer during an etching process, and separating the delamination stack and the support substrate one from the other. The delamination stack can include a process piece that can be one or more wafers or devices (e.g., thin-film devices) or one or more portions of the one or more devices. The support substrate can include one or more electrically insulative materials and the sacrificial layer can include one or more electrically conductive materials and/or one or more electrically semiconductive materials.

In some embodiments, the method can further include forming an electro-osmotic flow of the electrolyte solution between the delamination stack and the support substrate, where the electro-osmotic flow can extend from a surface of the electrolyte solution contained within an electrolyte vat to the electrically conductive material or the electrically semiconductive material of the sacrificial layer. In other embodiments, the method can further include positioning the support substrate to expose a first portion of the sacrificial layer in physical contact with the electrolyte solution and to maintain a second portion of the sacrificial layer free of physical contact with the electrolyte solution, and forming electrical current between a first electrode and a second electrode, where the first electrode can be in physical contact with the electrolyte solution or an electrolyte vat containing the electrolyte solution, and the second electrode can be in physical contact with the second portion of the sacrificial layer. The method can further include electrochemically oxidizing the electrically conductive material or the electrically semiconductive material with the electrical current to form product species in the electrolyte solution during the etching process.

In some embodiments, the first electrode can be an anode, the second electrode can be a cathode or a contact, and the electrical current flows from the cathode or the contact, through the second portion of the sacrificial layer, through the first portion of the sacrificial layer, through the electrolyte solution, and to the anode. The electrolyte solution can be an aqueous solution that can include one or more acidic reagents, one or more basic reagents, one or more metallic compounds, salts thereof, or any combination or mixture thereof. In some examples, the acidic reagents can include one or more compounds or reagents, such as, but not limited to, hydrochloric acid, sulfuric acid, nitric acid, phosphoric acid, acetic acid, dihydroxyacetic acid, citric acid, salts thereof, or any combination or mixture thereof. The basic reagents can include one or more compounds or reagents, such as, but not limited to, potassium hydroxide, sodium hydroxide, lithium hydroxide, cesium hydroxide, ammonium hydroxide, amines, salts thereof, or any combination or mixture thereof. The metallic compounds can include one or more metals or metal cations, such as, but not limited to, iron, copper, zinc, aluminum, magnesium, or any combination or mixture thereof. The electrolyte solution can include one or more anions, such as, but not limited to, $Cl^-$, $F^-$, $Br$, $O^{2-}$, $CO_3^{2-}$, $HCO_3^-$, $OH^-$, $NO_3^-$, $PO_4^{3-}$, $SO_4^{2-}$, $CH_3COO^-$, $HCOO^-$, $C_2O_4^{2-}$, $CN^-$, or any combination or mixture thereof, and one or more cations, such as, but not limited to, $HN_4^+$, $H_3O^+$, $H^+$, alkaline metal cations, rare earth metal cations, or any combination or mixture thereof.

In other exemplary embodiments, the method of separating the delamination stack and the support substrate can further include maintaining the support substrate substantially stationary and exerting a force to the delamination stack to separate the delamination stack from the support substrate, maintaining the delamination stack substantially stationary and exerting a force to the support substrate to separate the support substrate from the delamination stack, or exerting forces to the support substrate and the delamination stack to separate one from the other.

Prior to delaminating the workpiece, the method can include forming the workpiece by a variety of different way. In one exemplary embodiment, the method can further include forming or adhering the sacrificial layer on the support substrate, and then forming or adhering at least a portion of the process piece on the sacrificial layer. Alternatively, in another exemplary embodiment, the method can include forming or adhering the sacrificial layer on at least a portion of the process piece, and then forming or adhering the support substrate on the sacrificial layer.

The support substrate can include one or more electrically insulative materials, such as, but not limited to, silicon, silicon oxide, silica, silicon oxynitride, silicon nitride, aluminum oxide, alumina, acrylic materials, poly(methyl methacrylate) (PMMA), polycarbonate, or any combination or mixture thereof. The support substrate can include one or more of glass materials, ceramic materials, plastic or polymeric materials, adhesives, a semiconductive body or substrate at least partially coated with the electrically insulative material, or a conductive body or substrate at least partially coated with the electrically insulative material. The sacrificial layer can include one or more electrically conductive materials or one or more electrically semiconductive materials, such as, but not limited to, aluminum, nickel, copper, molybdenum, chromium, zinc, zinc oxide, zinc nitride, zinc oxynitride, alloys thereof, or any combination or mixture thereof. In some examples, the sacrificial layer can have a thickness of about 50 Å to about 2,000 Å.

In one or more exemplary embodiments, a protective surface or layer, can be included in the delamination stack. The protective surface or layer can be disposed between the sacrificial layer and the process piece. In some examples, the protective surface or layer can be a surface of the process piece, for example, an electrically insulative protective surface on the process piece. In other examples, the protective surface or layer, can be the protective surface or layer, such as a deposited or formed dielectric layer or an adhesion or adhesive layer applied to either the sacrificial layer and/or the process piece. In some examples, the protective surface or layer can include silicon oxide, silicon nitride, silicon oxynitride, other silicon-containing materials, dielectric materials, plastic or polymeric materials, adhesives, or any combination or mixture thereof. In some examples, the protective surface or layer can have a thickness of about 1,000 Å to about 10,000 Å.

In another exemplary embodiment, the delamination stack further can include a support film coupled to the process piece, and the process piece can be disposed between the support film and the sacrificial layer. In some examples, the support film can include one or more of plastic or polymeric materials, adhesives, a metallic layer, a conductive body or substrate at least partially coated with an electrically insulative material, or a semiconductive body or substrate at least partially coated with an electrically insulative material.

The process piece can include one or more wafers, substrate, or devices and/or one or more portions of the one or more wafers, substrate, or devices, such as, but is not limited to, a thin-film electronic device, a thin-film display, a thin-film transistor (TFT) circuit, a TFT backplane, a sensor, a photovoltaic cell, a light emitting diode (LED), an organic light emitting diode (OLED), a liquid crystal display (LCD), an electronic paper display device, a touch panel, an energy storage device, a thin-film battery, a capacitor, a thin-film supercapacitor, a microelectromechanical system (MEMS) device, a patterned wafer, a semiconductive wafer, a conductive wafer, a glass substrate, and a ceramic substrate.

In another exemplary embodiment, an electrochemical delamination system can include a power supply, a first electrode in electrical communication with the power supply, a second electrode in electrical communication with the power supply, an electrolyte vat that can contain an electrolyte solution, where the first electrode can be at least partially exposed to and in electrical communication with the electrolyte solution or the electrolyte vat, and a workpiece at least partially exposed to and in electrical communication with the electrolyte solution.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features can be arbitrarily increased or reduced for clarity of discussion. To facilitate understanding, identical reference numerals have been used, where possible, to designate identical elements that are common to the figures. It is contemplated that elements disclosed in one embodiment can be beneficially utilized on other embodiments without specific recitation.

DETAILED DESCRIPTION

Figure 1:
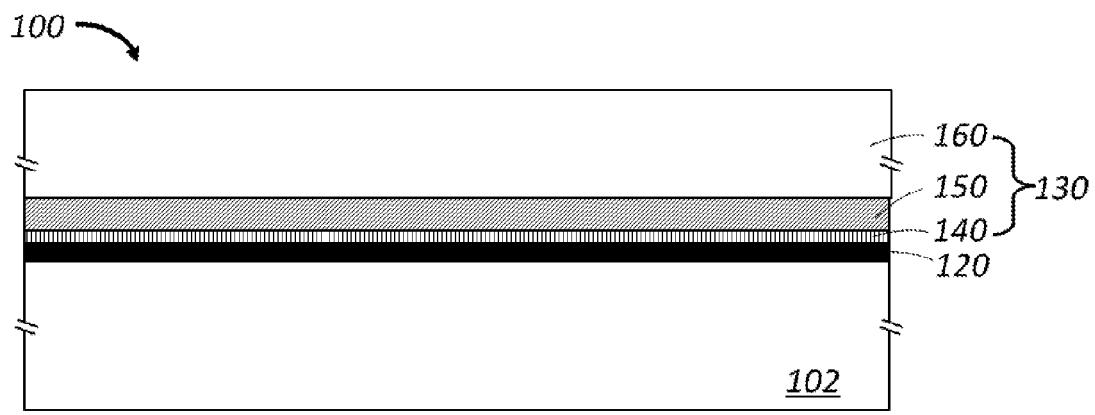
FIG. 1 depicts an exemplary workpiece containing a support substrate, a sacrificial layer, and a delamination stack, according to one or more embodiments disclosed herein.

Embodiments of the disclosure generally provide methods for delaminating workpieces, such as separating a delamination stack from a support substrate, and apparatuses for delaminating the workpieces. FIG. 1 depicts an exemplary workpiece 100 that can include at least a support substrate 102, a sacrificial layer 120, and a delamination stack 130, according to one or more embodiments. The sacrificial layer 120 can be disposed between the delamination stack 130 and the support substrate 102. In one exemplary embodiment, the delamination stack 130 can include at least a protective surface or layer 140 (e.g., an electrically insulative surface or layer), a process piece 150 (e.g., thin-film device or wafer), and a support film 160, as depicted in FIG. 1. The protective surface or layer 140 can be disposed between the process piece 150 and the sacrificial layer 120, and the process piece 150 can be disposed between the protective surface or layer 140 and the support film 160. The support film 160 can be formed, placed, adhered, or otherwise disposed on the process piece 150.

In one or more exemplary embodiments, a method can include processing the workpiece 100 by delaminating or otherwise separating the delamination stack 130 and the support substrate 102 disposed on the workpiece 100. The method can include exposing at least a portion of the workpiece 100 to an electrolyte solution 110, applying an electrical current through the sacrificial layer 120 and the electrolyte solution 110, selectively removing the electrically conductive material or the electrically semiconductive material from the sacrificial layer 120 during an etching process, and separating the delamination stack 130 and the support substrate 102 one from the other. The delamination stack 130 can include the process piece 150 that can be one or more wafers or devices (e.g., thin-film devices) or one or more portions of the one or more devices. The support substrate 102 can include one or more electrically insulative materials and the sacrificial layer 120 can include one or more electrically conductive materials and/or one or more electrically semiconductive materials.

The sacrificial layer 120 can be selectively etched or otherwise removed to separate the delamination stack 130 and the support substrate 102. The delamination process includes, but is not limited to, etching or removing the sacrificial layer 120, such as by an etchant reagent or an electrolyte solution by a chemical etching process and/or an electrochemical etching process, as well as separating the delamination stack 130 and the support substrate 102 one from the other. In an exemplary embodiment, the etchant reagent or the electrolyte solution can be an aqueous solution containing one or more acidic reagents, basic reagents, peroxide reagents, metallic compounds or metallic salts, or mixtures thereof.

The support substrate 102 can generally be a substrate that can include one or more dielectric materials, electrically non-conductive materials, electrically insulative materials, or other materials that are completely or substantially non-reactive with the etchant reagent or the electrolyte solution. Exemplary materials that can be contained in the support substrate 102 include, but are not limited to, glass, single crystal or polycrystalline materials, plastic, oligomeric, or polymeric materials, or mixtures thereof. In one or more exemplary embodiments, the support substrate 102 can include one or more semiconductive materials or one or more conductive materials covered, encapsulated, or otherwise coated with one or more electrically insulative materials, such as a semiconductor silicon wafer covered with a silicon oxide or silicon nitride, or an aluminum plate with an anodized surface of aluminum oxide. The sacrificial layer 120 can contain one or more electrically conductive materials, electrically semiconductive materials, or mixtures thereof, which can be completely or substantially reactive with the etchant reagent or the electrolyte solution. Exemplary electrically conductive materials and/or electrically semiconductive materials that can be contained in the sacrificial layer 120 include, but are not limited to, aluminum, nickel, copper, molybdenum, chromium, zinc, zinc oxide, zinc nitride, zinc oxynitride, silicon, alloys thereof, or mixtures thereof.

In one or more exemplary embodiments, a protective surface or layer 140, can be included in the delamination stack 130. The protective surface or layer 140 can be disposed between the sacrificial layer 120 and the process piece 150. The protective surface or layer 140 can contain one or more dielectric materials, electrically non-conductive materials, electrically insulative materials, or other materials that are completely or substantially non-reactive with the etchant reagent or the electrolyte solution. Exemplary materials that can be contained in the protective surface or layer 140 include, but are not limited to, silicon oxide, silicon nitride, silicon oxynitride, other silicon-containing materials, dielectric materials, plastic or polymeric materials, adhesives, or any combination or mixture thereof. In some examples, the protective surface or layer 140 can have a thickness of about 1,000 Å to about 10,000 Å.

In some examples, the protective surface or layer 140 can be a surface of the process piece 150, for example, an electrically insulative protective surface on the process piece 150. In other examples, the protective surface or layer 140, can be an electrically insulative protective layer, such as a deposited or formed dielectric layer or an adhesion or adhesive layer applied to either the sacrificial layer 120 and/or the process piece 150. The process piece 150 can contain two or more layers, including the protective surface or layer 140, and can generally include or be an electronic device or a portion of an electronic device, such as a thin-film display, a thin-film transistor (TFT), a light emitting diode (LED), or other devices. In some examples, the process piece 150 can also be a wafer or substrate or a portion of a wafer or substrate that can contain of one or more materials, such as a piece of a silicon wafer.

In some examples, the process piece 150 can be a wafer that has one or more devices formed or otherwise disposed on one side of the wafer (e.g., front side) and it is desirable to process the other side of the wafer (e.g., backside). Therefore, the front side of the process piece 150 can be adhered to or facing towards the sacrificial layer 120 and the backside of the process piece 150 can be exposed to one or more processes that can include polishing, depositing, etching, patterning, or other manufacturing processes.

The support film 160 can provide structure support to the process piece 150 during and after the delamination process. In some embodiments, the support film 160 can be deposited or otherwise formed on the process piece 150 and/or the sacrificial layer 120. Alternatively, in other embodiments, the support film 160 can be adhered or otherwise applied on the process piece 150 and/or the sacrificial layer 120. The support film 160 can have one layer or multiple layers of the same or different materials. The support film 160 can include one or more materials, such as, but not limited to, polymeric or plastic materials, metallic layers, adhesives and/or laminates, or mixtures thereof. In some examples, the support film 160 can include sheets or films of plastic, metal, or paper, or mixtures thereof, laminated on the process piece 150 and/or the sacrificial layer 120, for example, by an adhesive.

Figure 2A:
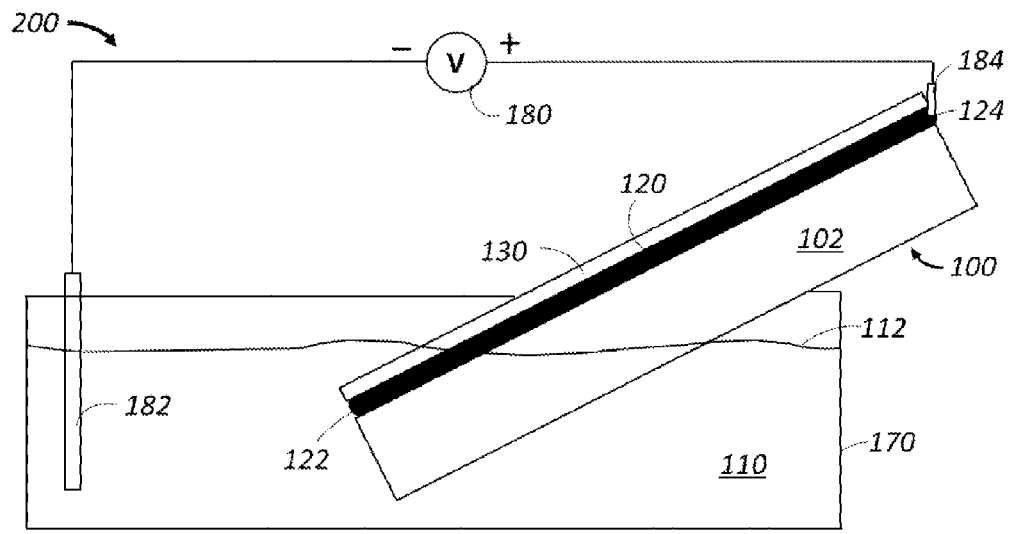
FIGS. 2A and 2B depict an exemplary electrochemical delamination system containing a workpiece disposed in an angled position, according to one or more embodiments disclosed herein.
Figure 2B:
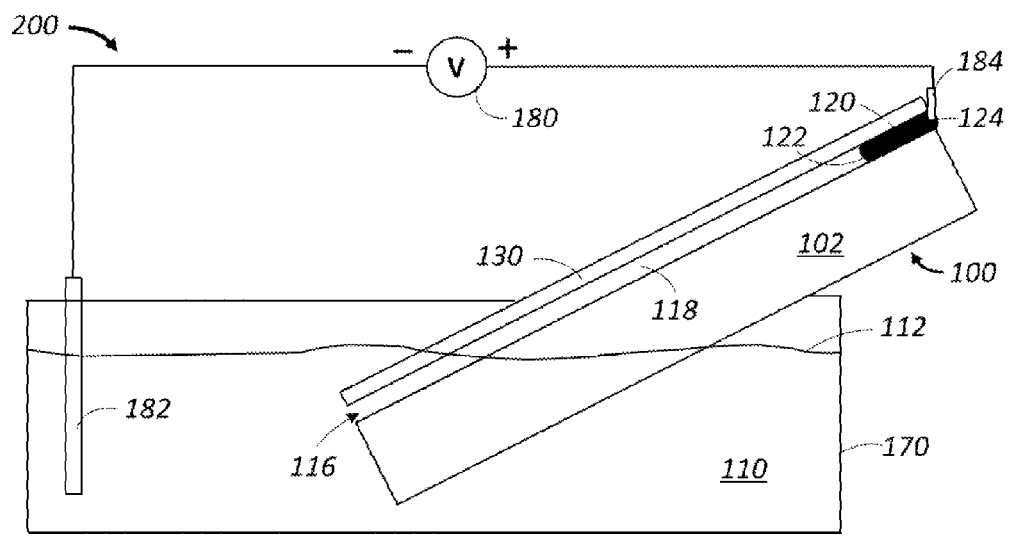

FIGS. 2A and 2B depict an exemplary electrochemical delamination system 200 that can be configured to contain and process the workpiece 100, according to one or more exemplary embodiments. In one exemplary embodiment, the electrochemical delamination system 200 can include a power supply 180, an electrode 182, in electrical contact or communication with the power supply 180, a contact 184 in electrical contact or communication with the power supply 180, and an electrolyte vat 170 that can contain an etchant reagent or an electrolyte solution 110. The power supply 180 can be a direct current (DC) power supply, a pulse-DC power supply, an alternating current (AC) power supply, or a radio-frequency power supply, or other power supply source.

The electrode 182 can include one or more conductive materials, such as graphite, stainless steel, nickel, chromium, silver, gold, platinum, palladium, tungsten, titanium, alloys thereof, or combination thereof. The contact 184 can include one or more conductive materials, such as stainless steel, nickel, chromium, silver, gold, platinum, palladium, tungsten, alloys thereof, or combination thereof. The electrode 182 can be a standalone unite as shown in FIGS. 2A and 2B, or integrated as a part of a component of the delamination system 200. For example, the electrolyte vat 170 can be made from or include one or more conductive materials, such as stainless steel, and can be used as the electrode 182. In another embodiment, the contact 184 can be in physical contact and electrical communication with the sacrificial layer 120, and the conductive material and/or semiconductive material in the sacrificial layer 120 can serve as a sacrificial cathode involving electrochemical reactions during the processes in delamination system 200.

In one or more exemplary embodiments, the electrode 182 can be a negative electrode and/or an anode and can be at least partially exposed to and/or in electrical communication with the electrolyte solution 110 and/or the electrolyte vat 170. In some examples, the electrode 182 can be an anode and can be at least partially exposed to and in electrical communication with the electrolyte solution 110. In other examples, the electrode 182 can be a negative electrode and can be in physical contact and electrical communication with the electrolyte vat 170 and the electrolyte vat 170 can be in electrical communication with the sacrificial layer 120 via the electrolyte solution 110. In one or more exemplary embodiments, the contact 184 can be an electrical contact, a positive electrode, and/or a cathode and can be at least partially exposed to and/or in electrical communication with the work piece 100, such as the sacrificial layer 120. In some examples, the contact 184 can be a positive electrode and can be in physical contact and electrical communication with the sacrificial layer 120.

The workpiece 100 can be at least partially exposed to and in electrical communication with the electrolyte solution 110 within the electrolyte vat 170. Generally, a first portion 122 of the sacrificial layer 120 can be in physical contact with the electrolyte solution 110, such as below an upper surface or a fluid line 112 of the electrolyte solution 110. A second portion 124 of the sacrificial layer 120 can be maintained free of physical contact with the electrolyte solution 110, such as above the upper surface or the fluid line 112. The electrode 182 can be at least partially, substantially, or completely exposed to and in electrical communication with the electrolyte solution 110 contained within the electrolyte vat 170, and therefore, also in electrical communication with the first portion 122 of the sacrificial layer 120 via the electrolyte solution 110. The sacrificial layer 120 can serve as a cathode that contacts the electrolyte solution 110 and connects with the power supply 180 through the contact 184. The contact 184 can be at least partially, substantially, or completely in physical contact and in electrical communication with the second portion 124 of the sacrificial layer 120.

FIG. 2A depicts the workpiece 100 prior to the delamination process or at an initial or early stage of the delamination process and the sacrificial layer 120 can be completely or significantly disposed between the support substrate 102 and the delamination stack 130. In one embodiment, an electrical current can be applied from the power supply 180 via the contact 184, through the second portion 124 of the sacrificial layer 120, through the sacrificial layer 120, through the first portion 122 of the sacrificial layer 120, through the electrolyte solution 110, through the electrode 182, and back to the power supply 180.

FIG. 2B depicts the workpiece 100 at a latter or advance stage of the delamination process, such that the sacrificial layer 120 has been significantly etched or otherwise removed and the support substrate 102 and the delamination stack 130 have almost been separated one from the other. As the delamination and etching processes advance and the first portion 122 of the sacrificial layer 120 is etched, a passageway 116, such as a void or an opening, can be formed between the support substrate 102 and a lower surface (e.g., the electrically insulative layer 140) of the delamination stack 130 within the electrolyte solution 110. As the electrically conductive material or the electrically semiconductive material of the sacrificial layer 120 is chemically oxidized or otherwise etched away, the formed product species can be dissolved, suspended, or otherwise contained in the electrolyte solution 110.

In other embodiments, the method can further include forming an electro-osmotic flow 118 of the electrolyte solution 110 between the delamination stack 130 and the support substrate 102. The electro-osmotic flow 118 can be formed within the passageway 116 and driven by the electrical current flowing between the electrode 182 and the contact 184. The electro-osmotic flow 118 can keep the electrolyte solution 110 in electrical contact with the sacrificial layer 113 in the electrochemical system and maintain the electrochemical process. The electro-osmotic flow 118 can overcome resistance and can extend from the surface or the fluid line 112 of the electrolyte solution 110 to the electrically conductive material or the electrically semiconductive material of the first portion 122 of the sacrificial layer 120. The electro-osmotic flow 118 can keep the electrolyte solution 110 in electrical contact with the electrically conductive material or the electrically semi-conductive material of the sacrificial layer 120. At least a portion, if not most or all, of the formed product species at or near the first portion 122 of the sacrificial layer 120 can be dissolved, suspended, or otherwise contained in the electro-osmotic flow 118 and displaced into the electrolyte solution 110 within the electrolyte vat 170.

In another embodiment, the workpiece 100 in the electrochemical delamination system 200, as depicted in FIGS. 2A and 2B, can be disposed in an angled position that can be between a horizontal position (e.g., at or parallel to the average plain of the fluid line 112) and a vertical position (e.g., about 90° relative to the average plain of the fluid line 112). The workpiece 100 can be maintained in the angled position, a horizontal position, a vertical position, or any other desired position by resting or otherwise supporting the workpiece 100 on the walls or surfaces of the electrolyte vat 170 or by securing the workpiece 100 with clamps and extension arms coupled with a stand (not shown). The angled position can be at an angle of greater than 0° and less than 90°, about 5° to about 85°, about 10° to about 80°, about 20° to about 70°, about 30° to about 60°, about 40° to about 50°, such as, for example, about 45°, as depicted in FIGS. 2A-2B. Alternatively, the angled position can be at an angle of greater than 90° and less than 180°, about 95° to about 175°, about 100° to about 170°, about 110° to about 160°, about 120° to about 150°, about 130° to about 140°, such as, for example, about 135°.

In one example, the support substrate 102 of the workpiece 100 was a glass substrate and the sacrificial layer 120 contained aluminum or an aluminum alloy and had a thickness of about 300 Å and an electrical conductivity of about $1 \times 10^7$ S/m. In another example, the support substrate 102 of the workpiece 100 was a glass substrate and the sacrificial layer 120 contained zinc oxynitride and had a thickness of about 1,000 Å and an electrical conductivity of about $1 \times 10^{-2}$ S/m. The protective surface or layer 140 was deposited over the sacrificial layer 120, contained silicon nitride, and had a thickness of about 4,000 Å. The workpiece 100 was exposed to an electrolyte solution 110 containing hydrochloric acid (about 1 vol % HCl). A positive DC voltage of about 30 V was applied from the power supply 180, through the contact 184, through the sacrificial layer 120, through the electrolyte solution 110, through the electrode 182, and back to the power supply 180. The exemplary test was conducted at a temperature of about 25° C. and a relative humidity of about 65% or greater.

Figure 3A:
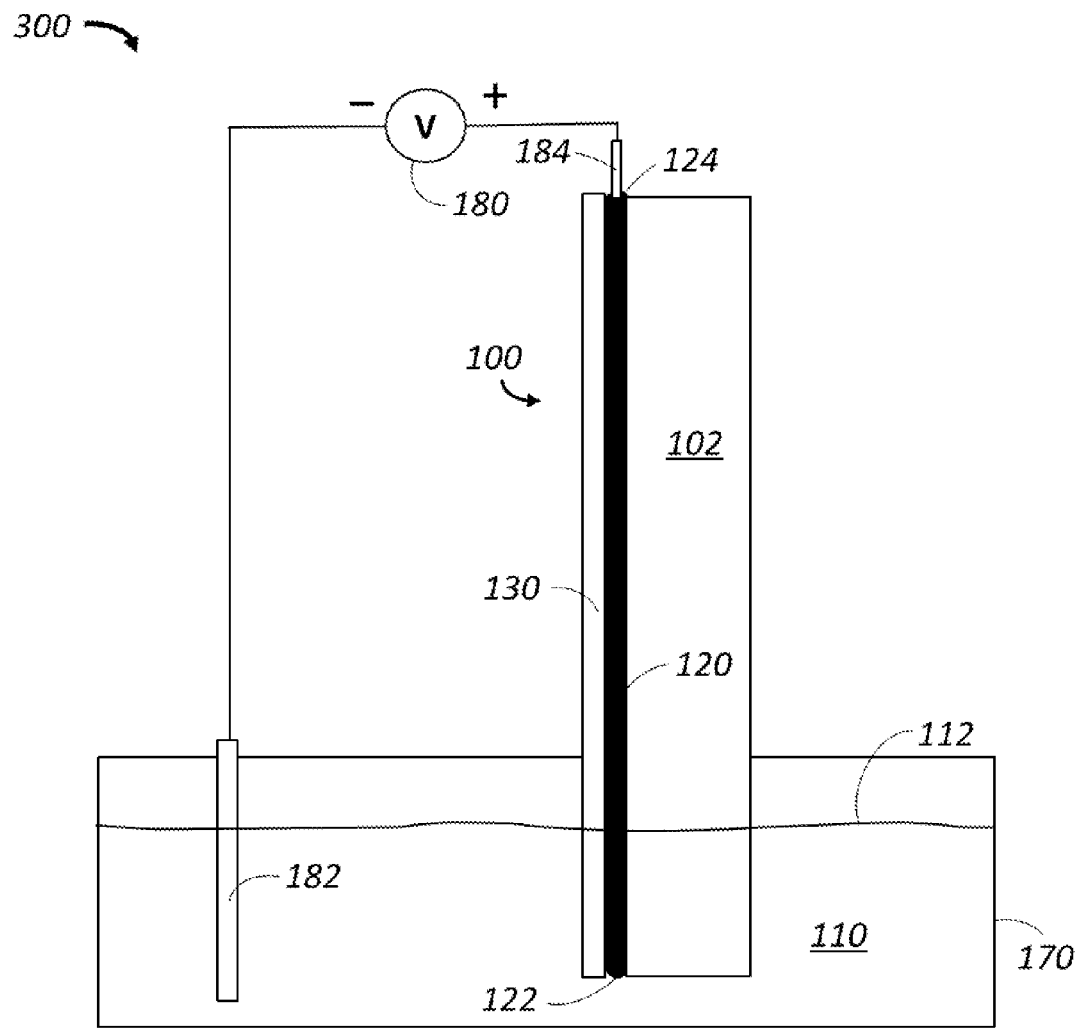
FIGS. 3A-3C depict another exemplary electrochemical delamination system containing a workpiece disposed in a vertical position, according to one or more embodiments disclosed herein.
Figure 3B:
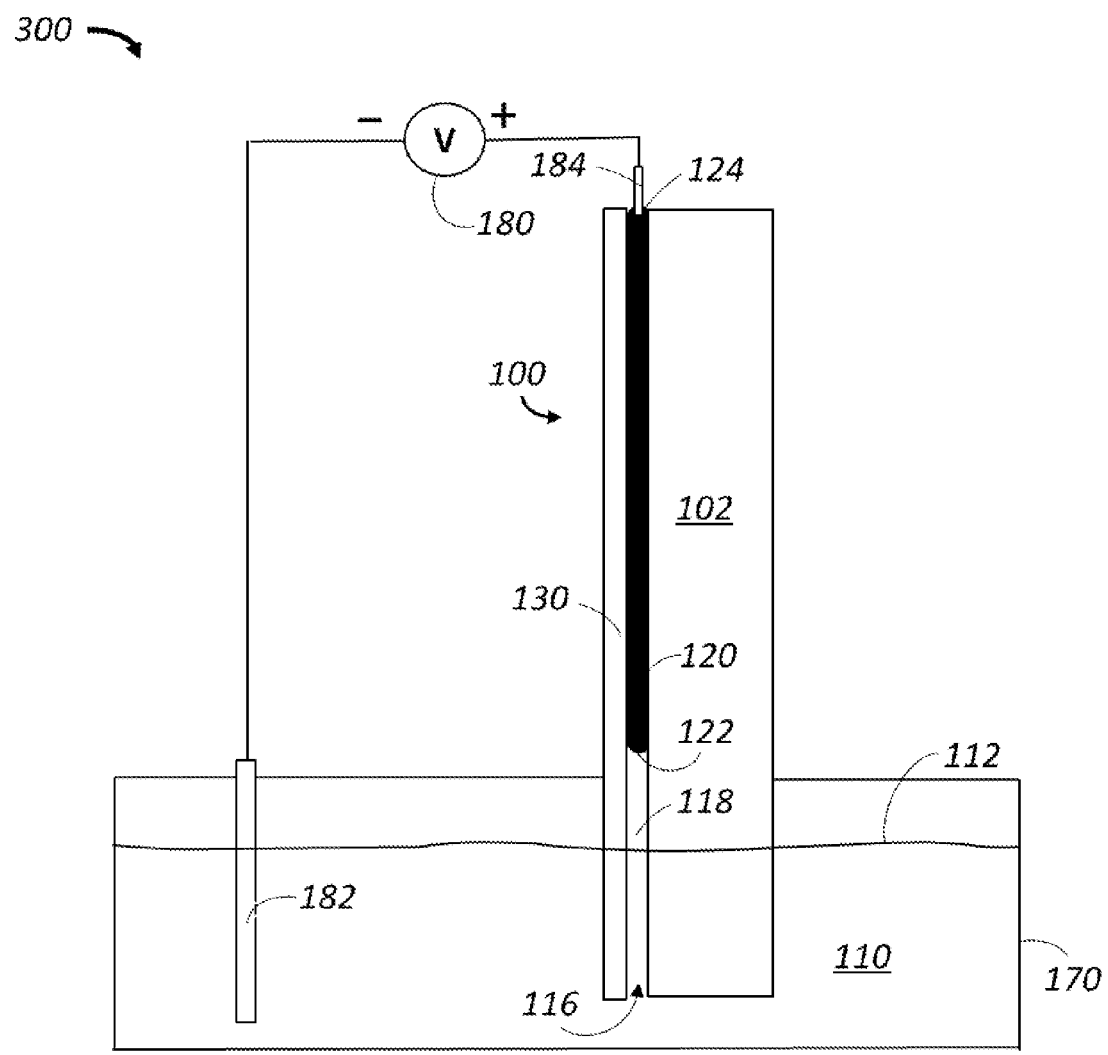
Figure 3C:
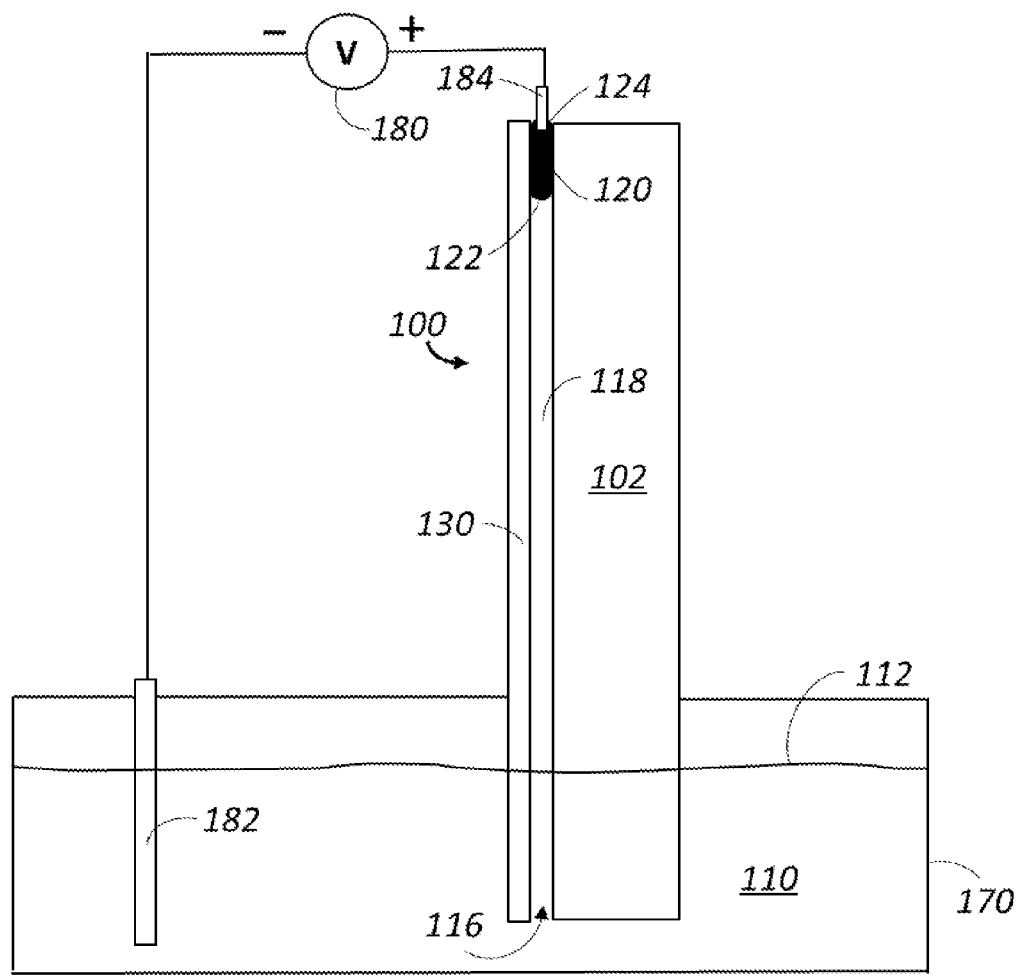

FIGS. 3A-3C depict an exemplary electrochemical delamination system 300 that can be configured to contain and process the workpiece 100 disposed in a vertical position, according to one or more exemplary embodiments. The vertical position can be about 90° relative to the average plain of the fluid line 112 of the electrolyte solution 110. FIG. 3A depicts the workpiece 100 prior to the delamination process or at an initial or early stage of the delamination process and the sacrificial layer 120 can be completely or significantly disposed between the support substrate 102 and the delamination stack 130. FIG. 3B depicts the workpiece 100 at an intermediate stage of the delamination process, such that a segment of the sacrificial layer 120 has been etched or otherwise removed to form the passageway 116. The first portion 122 of the sacrificial layer 120 can be above the fluid line 112 of the electrolyte solution 110 (as depicted in FIG. 3B) and the electro-osmotic flow 118 can maintain the electrical communication between the electrode 182 and the sacrificial layer 120 via the electrolyte solution 110. FIG. 3C depicts the workpiece 100 at a latter or advance stage of the delamination process, such that a larger segment of the sacrificial layer 120 has been etched or otherwise removed and the support substrate 102 and the delamination stack 130 have almost been separated one from the other.

Figure 4:
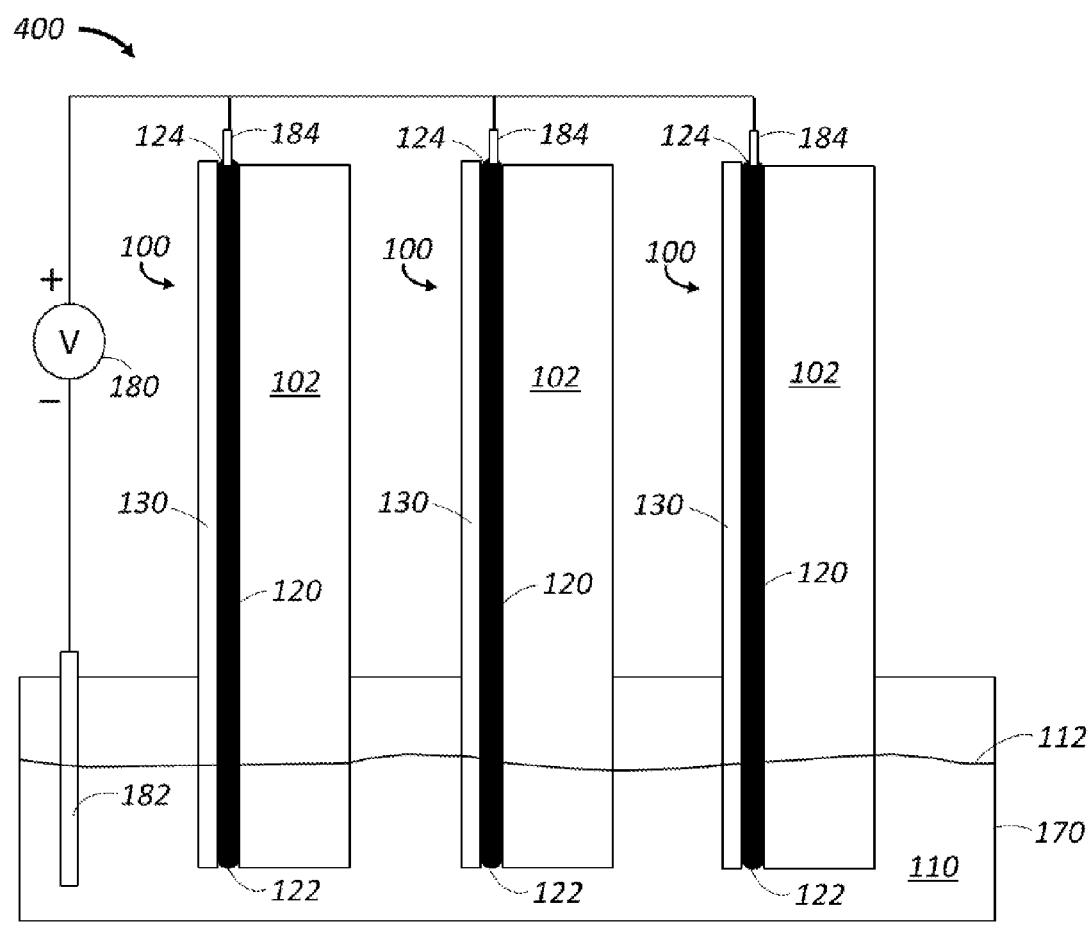
FIG. 4 depicts another exemplary electrochemical delamination system containing multiple workpieces disposed in vertical positions, according to one or more embodiments disclosed herein.

FIG. 4 depicts an exemplary electrochemical delamination system 400 that can be configured to contain and process multiple or a plurality of the workpieces 100 at the same time, according to one or more exemplary embodiments. In exemplary embodiments, the electrochemical delamination system 400 can include at least one power supply 180, two or more electrodes 182 in electrical communication with the power supply 180, two or more contacts 184 in electrical communication with the power supply 180, and the electrolyte vat 170 that can contain the etchant reagent or the electrolyte solution 110. In one exemplary embodiment, as depicted in FIG. 4, the electrochemical delamination system 400 can include three electrodes 182 and three contacts 184 in electrical communication with the power supply 180. In other embodiments, the electrochemical delamination system 400 can have two electrodes to about one hundred electrodes or more that are utilized as the electrodes 182 and can have two electrodes to about one hundred electrodes or more that are utilized as the contacts 184.

In some exemplary embodiments, the plurality of the workpieces 100 can be contained and processed in vertical positions by the electrochemical delamination system 400, as depicted in FIG. 4. In other exemplary embodiments, not shown, the plurality of the workpieces 100 can also be contained and processed in horizontal positions or angled positions by the electrochemical delamination system 400, as similarly described for electrochemical delamination systems 600 and 200, respectively.

Figure 5:
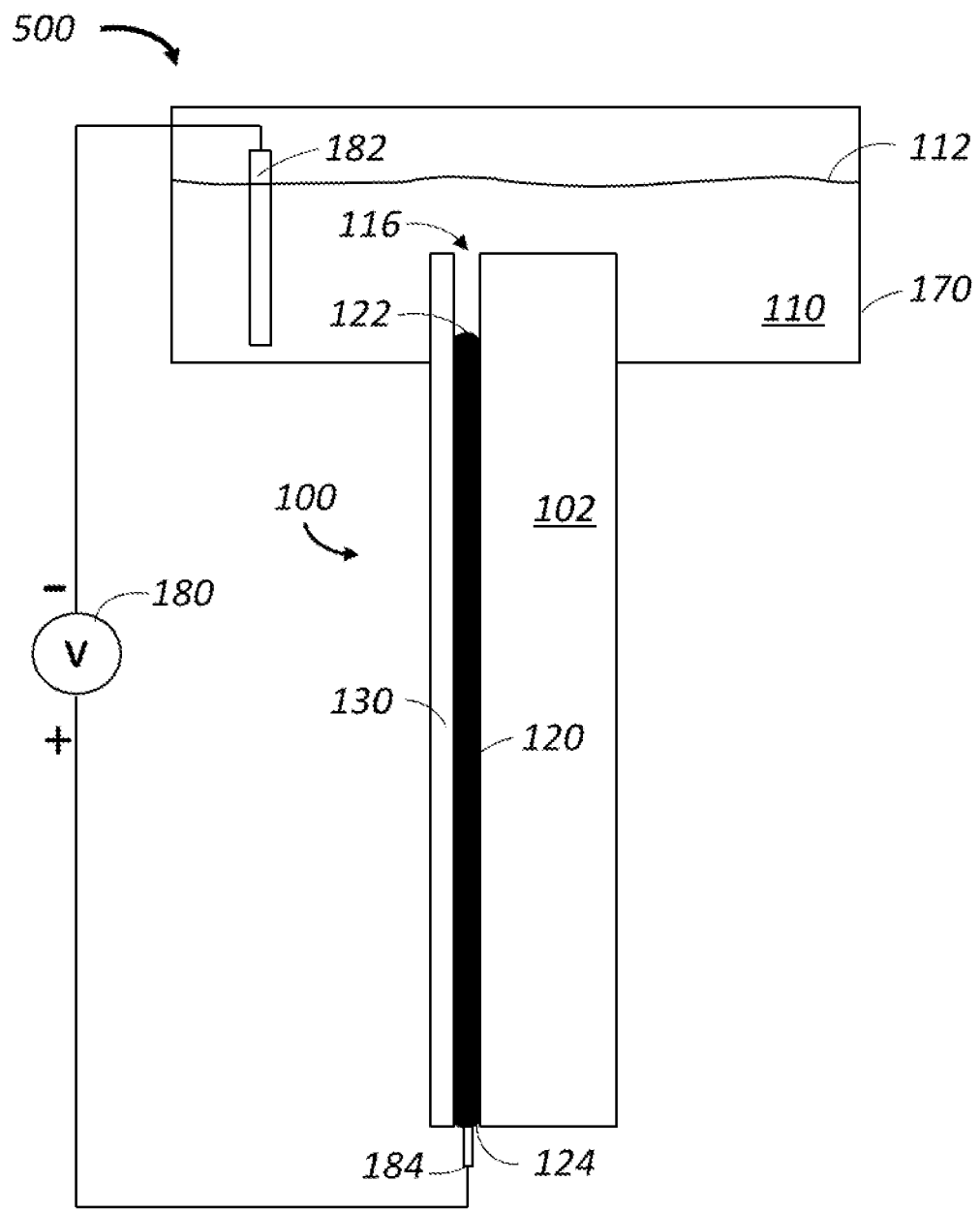
FIG. 5 depicts another exemplary electrochemical delamination system containing a workpiece disposed in a vertical position, according to one or more embodiments disclosed herein.

FIG. 5 depicts an exemplary electrochemical delamination system 500 that can be configured to contain and process the workpiece 100, according to one or more exemplary embodiments. The electrochemical delamination system 500 can be configured to position the workpiece 100 below the fluid line 112 of the electrolyte solution 110 within the electrolyte vat 170. An upper portion of the workpiece 100 can be disposed within the electrolyte vat 170 and a lower portion of the workpiece 100 can be disposed outside and below the electrolyte vat 170, as depicted in FIG. 5. In addition, FIG. 5 depicts the workpiece 100 at an intermediate stage of the delamination process, such that a segment of the sacrificial layer 120 has been etched or otherwise removed to form the passageway 116. The first portion 122 of the sacrificial layer 120 can be disposed below the fluid line 112 of the electrolyte solution 110 such that the electrical communication between the electrode 182 and the sacrificial layer 120 via the electrolyte solution 110 can be maintained without an electro-osmotic flow within the passageway 116.

In some exemplary embodiments, the workpiece 100 can be contained and processed in a vertical position by the electrochemical delamination system 500, as depicted in FIG. 5. In other exemplary embodiments, not shown, the workpiece 100 can also be contained and processed in a horizontal position or an angled position by the electrochemical delamination system 500, as similarly described for electrochemical delamination systems 600 and 200, respectively. In other exemplary embodiments, not shown, a plurality of the workpieces 100 can be contained and processed by the electrochemical delamination system 500, as similarly described for electrochemical delamination system 400.

Figure 6A:
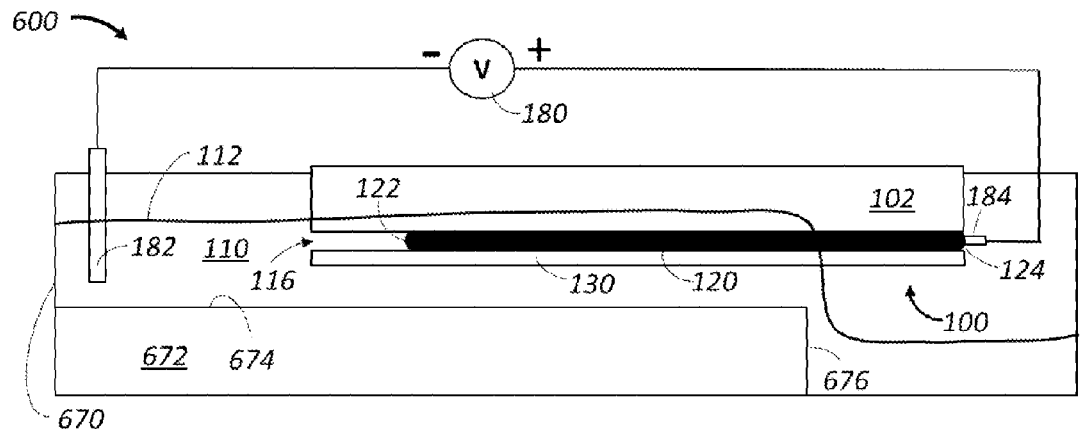
FIGS. 6A and 6B depict another exemplary electrochemical delamination system containing a workpiece disposed in a horizontal position, according to one or more embodiments disclosed herein.
Figure 6B:
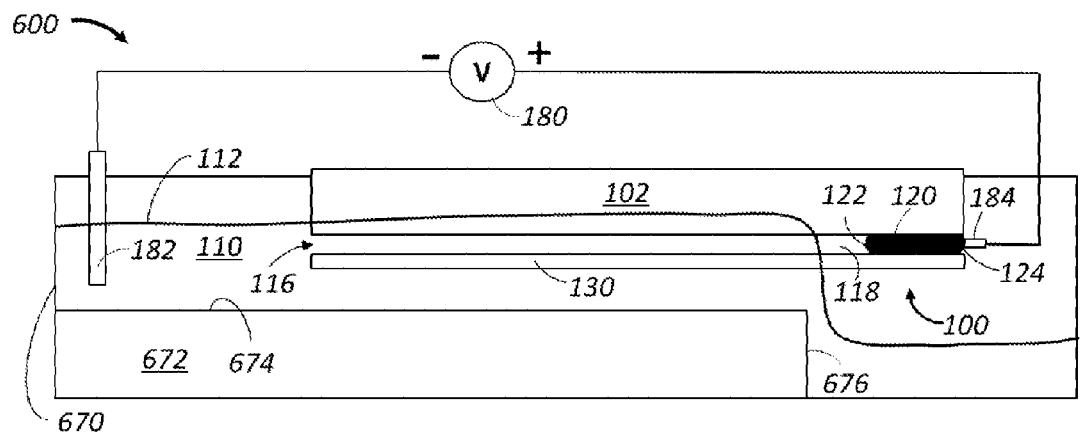

FIGS. 6A and 6B depict an exemplary electrochemical delamination system 600 that can be configured to contain and process the workpiece 100 in horizontal positions, according to one or more exemplary embodiments. In one exemplary embodiment, the electrochemical delamination system 600 can include the power supply 180, the electrode 182 in electrical communication with the power supply 180, the contact 184 in electrical communication with the power supply 180, and an electrolyte vat 670 that can have one or more steps or step members 672 and can contain the etchant reagent or the electrolyte solution 110. The electrochemical delamination system 600 can be configured to circulate or otherwise flow the electrolyte solution 110 across an upper surface 674 of the step member 672, off a side surface 676 of the step member 672, and into the remaining portion of the electrolyte vat 670. The horizontal position can be relatively at or parallel to the average plain of the fluid line 112 flowing across upper surface 674 of the step member 672 within the electrochemical delamination system 600, according to one or more exemplary embodiments.

In one exemplary embodiment, electrochemical delamination system 600 can be configured to position the workpiece 100 in a "face-down" and horizontal position such that the delamination stack 130 can be facing into the electrolyte vat 670 and towards the step member 672 and the support substrate 102 can be facing out of the electrolyte vat 670 and away from the step member 672. In another exemplary embodiment, not illustrated, the electrochemical delamination system 600 can be configured to position the workpiece 100 in a "face-up" and horizontal position such that the delamination stack 130 can be facing out of the electrolyte vat 670 and away from the step member 672 and the support substrate 102 can be facing into the electrolyte vat 670 and towards the step member 672.

In at least the face-down and horizontal position, the workpiece 100 can be at least partially exposed to and in electrical communication with the electrolyte solution 110 within the electrolyte vat 670. The first portion 122 of the sacrificial layer 120 can be exposed to and in electrical communication with the electrolyte solution 110 within the electrolyte vat 670. The second portion 124 of the sacrificial layer 120 can be maintained free of physical contact with the electrolyte solution 110, such as above the upper surface or the fluid line 112 or otherwise positioned out of the electrolyte solution 110. The electrode 182 can be at least partially, substantially, or completely exposed to and in electrical communication with the electrolyte solution 110 contained within the electrolyte vat 670, and therefore, also in electrical communication with the first portion 122 of the sacrificial layer 120. The contact 184 can be at least partially, substantially, or completely in physical contact and in electrical communication with the second portion 124 of the sacrificial layer 120.

FIG. 6A depicts the workpiece 100 at an intermediate stage of the delamination process, such that a segment of the sacrificial layer 120 has been etched or otherwise removed to form the passageway 116. The first portion 122 of the sacrificial layer 120 can be disposed below the fluid line 112 of the electrolyte solution 110 such that the electrical communication between the electrode 182 and the sacrificial layer 120 via the electrolyte solution 110 can be maintained without an electro-osmotic flow within the passageway 116.

FIG. 6B depicts the workpiece 100 at a latter or advance stage of the delamination process, such that a larger segment of the sacrificial layer 120 has been etched or otherwise removed and the support substrate 102 and the delamination stack 130 have almost been separated one from the other. The electro-osmotic flow 118 can extend from the surface or the fluid line 112 of the electrolyte solution 110, across the support substrate 102 and/or the surface of the delamination stack 130, to the electrically conductive material or the electrically semiconductive material of the first portion 122 the sacrificial layer 120.

In one exemplary embodiment, a method for forming the process piece 150 can include forming, depositing, adhering, coupling, or otherwise connecting the sacrificial layer 120 on or with the support substrate 102 and can include forming, depositing, adhering, coupling, or otherwise connecting the delamination stack 130 on or with the sacrificial layer 120. In one example, a method for forming the process piece 150 can include forming the sacrificial layer 120 on the support substrate 102 and forming the delamination stack 130 on the sacrificial layer 120. The method can further include separating the delamination stack 130 and the support substrate 102 by exposing the sacrificial layer 120 to the etchant reagent or the electrolyte solution 110 while removing the electrically conductive material or the electrically semiconductive material during the etching and delamination process.

In some embodiments, the method can include applying an electrical current through the sacrificial layer 120 and electrochemically oxidizing or otherwise reacting the electrically conductive material and/or the electrically semiconductive material of the sacrificial layer 120 with the electrical current to form product species in the etchant reagent or the electrolyte solution 110 during the etching process. In other exemplary embodiments, the method can further include positioning the support substrate 102 to expose the first portion 122 of the sacrificial layer 120 in physical contact with the electrolyte solution 110, such as below the upper surface or the fluid line 112 of the electrolyte solution 110, while maintaining the second portion 124 of the sacrificial layer 120 free of physical contact with the electrolyte solution 110, such as above the upper surface or the fluid line 112.

In some exemplary embodiments, the method can also include applying the electrical current to the second portion 124 of the sacrificial layer 120, through the sacrificial layer 120, and out of the first portion 122 of the sacrificial layer 120. The first portion 122 of the sacrificial layer 120 can be in electrical communication with a first electrode, such as the electrode 182, via the electrolyte solution 110 and the second portion 124 of the sacrificial layer 120 can be in physical contact and electrical communication with a second electrode, such as the contact 184. In other exemplary embodiments, the method can further include flowing the electrical current from the power supply 180, through the contact 184 in contact with the second portion 124 of the sacrificial layer 120, through the second portion 124 of the sacrificial layer 120 maintained free of the electrolyte solution 110, out of the first portion 122 of the sacrificial layer 120 exposed to the electrolyte solution 110, through the electrolyte solution 110, through the electrode 182 exposed to the electrolyte solution 110, and to the power supply 180 during the etching process.

In some exemplary embodiments, the method can further include chemically oxidizing, reducing, or otherwise reacting the electrically conductive material or the electrically semiconductive material of the sacrificial layer 120 to form product species in the etchant reagent or the electrolyte solution 110 without applying an electrical current during the etching and delamination process. In many examples, the method can include chemically oxidizing the electrically conductive material or the electrically semiconductive material of the sacrificial layer 120 to form oxidized product species in the etchant reagent or the electrolyte solution 110.

In another embodiment, a method for removing the process piece 150 from the support substrate 102 can include exposing at least a portion of the workpiece 100 to an etchant reagent or an electrolyte solution 110 and applying an electrical current through the sacrificial layer 120 and the electrolyte solution 110. The method can also include removing the electrically conductive material or the electrically semiconductive material from the sacrificial layer 120 during an etching process and separating the delamination stack 130 and the support substrate 102 one from the other. The method can further include forming an electro-osmotic flow 118 of the electrolyte solution 110 across, on, or otherwise along the support substrate 102. The electro-osmotic flow 118 can extend from the surface or the fluid line 112 of the electrolyte solution 110 contained within the electrolyte vat 170 to the electrically conductive material or the electrically semiconductive material of the sacrificial layer 120.

The etchant reagent or the electrolyte solution 110 can be an aqueous solution containing one or more metallic compounds or metallic salts, acidic reagents, basic reagents, peroxide reagents, or mixtures thereof. The metallic compound or metallic salt can generally include one or more elements of metal cations, such as iron, copper, zinc, aluminum, magnesium, potassium, or mixtures thereof. Exemplary metallic compounds or metallic salts can include, but are not limited to, iron (III) chloride, copper (II) sulfate, copper (II) chloride, zinc sulfate, zinc chloride, derivatives thereof, or mixtures thereof. Exemplary acidic reagents can include, but are not limited to, hydrochloric acid, sulfuric acid, nitric acid, phosphoric acid, acetic acid, dihydroxyacetic acid, citric acid, formic acid, derivatives thereof, or mixtures thereof. Exemplary basic reagents can include, but are not limited to, potassium hydroxide, sodium hydroxide, lithium hydroxide, cesium hydroxide, ammonium hydroxide, organic ammonium hydroxides (e.g., dimethylammonium hydroxide), aluminum hydroxide, magnesium hydroxide, amines, salts thereof, derivatives thereof, or any combination or mixture thereof. Peroxide reagents generally include inorganic peroxides and/or organic peroxides and hydroperoxides. Exemplary peroxide reagents can include, but are not limited to, hydrogen peroxide, lithium peroxide, sodium peroxide, potassium peroxide, calcium peroxide, magnesium peroxide, lithium perchlorate, sodium perchlorate, potassium perchlorate, calcium perchlorate, magnesium perchlorate, benzoyl peroxide, acetone peroxide, tert-butyl hydroperoxide, derivatives thereof, or mixtures thereof. In some embodiments, the electrolyte solution 110 can contain one or more types of anions, such as $Cl^-$, $F^-$, $Br$, $O^{2-}$, $CO_3^{2-}$, $HCO_3^-$, $OH^-$, $NO_3^-$, $PO_4^{3-}$, $SO_4^{2-}$, $CH_3COO^-$, $HCOO^-$, $C_2O_4^{2-}$, $CN^-$, derivatives thereof, or mixtures thereof and can contain one or more types of cations, such as $HN_4^+$, $H_3O^+$, $H^+$, derivatives thereof, or mixtures thereof.

In some embodiments, the method of separating the delamination stack 130 and the support substrate 102 can further include maintaining the support substrate 102 substantially stationary and exerting a force to separate the delamination stack 130 from the support substrate 102. In other embodiments, the method of separating the delamination stack 130 and the support substrate 102 can further include maintaining the delamination stack 130 substantially stationary and exerting a force to separate the support substrate 102 from the delamination stack 130. In other embodiments, the method of separating the delamination stack 130 and the support substrate 102 can further include exerting forces to the support substrate 102 and the delamination stack 130 to separate one from the other.

The support substrate 102 can be one of a variety of substrates containing one or more electrically insulative materials or other materials that are completely or substantially non-reactive with the etchant reagent or the electrolyte solution 110. The support substrate 102 can be a glass substrate, a ceramic substrate, a crystalline substrate, a plastic or polymeric substrate, a semiconductive and conductive substrate covered with an insulative material, as well as other types of substrates. Therefore, the support substrate 102 can contain glass, ceramic, a single crystal or polycrystalline, a plastic or polymeric material, or a semiconductor wafer covered with an oxide or nitride layer, or a metal substrate covered with an insulative material coating. The electrically insulative material of the support substrate 102 can contain silicon, silicon oxide, quartz, silica, silicon oxynitride, silicon nitride, aluminum oxide, alumina, acrylic materials, poly(methyl methacrylate) (PMMA), polycarbonate, derivatives thereof, or any combination thereof. The support substrate 102 can have a thickness of about 0.1 cm to about 1 cm, for example, about 0.7 mm for a glass substrate or about 0.3 mm for a silicon wafer.

The sacrificial layer 120 can include one or more electrically conductive materials, electrically semiconductive materials, and/or mixtures thereof and therefore generally can have an electrical conductivity of greater than $1 \times 10^{-8}$ S/m. The electrically conductive material or the electrically semiconductive material in the sacrificial layer 120 can generally be more susceptible to chemical reduction and/or electrical reduction. In some exemplary embodiments, the electrically conductive material contained in the sacrificial layer 120 can have an electrical conductivity of about $1 \times 10^3$ S/m to about $1 \times 10^8$ S/m, such as about $1 \times 10^7$ S/m. In other exemplary embodiments, the electrically semiconductive material contained in the sacrificial layer 120 can have an electrical conductivity of about $1 \times 10^{-3}$ S/m to about $1 \times 10^{-5}$ S/m, such as about $1 \times 10^{-2}$ S/m. The electrically conductive material or the electrically semiconductive material in the sacrificial layer 120 can contain aluminum, zinc, nickel, copper, molybdenum, chromium, titanium, silver, zinc oxide, zinc oxynitride, zinc nitride, derivatives thereof, alloys thereof, or mixtures thereof. The sacrificial layer 120 can have a thickness of about 50 Å to about 2,000 Å, about 75 Å to about 1,000 Å, about 100 Å to about 600 Å, or about 200 Å to about 400 Å, for example, about 300 Å.

The sacrificial layer 120 can be formed on the support substrate 102 by a vapor deposition process, a wet deposition process, a spin-on coating process, a painting, printing, or soldering process, a taping or foiling process, as well as other deposition techniques. Exemplary vapor deposition processes can include a physical vapor deposition (PVD) or sputtering process, a chemical vapor deposition (CVD) process, a plasma-enhanced CVD (PE-CVD) process, an atomic layer deposition (ALD) process, a plasma-enhanced ALD (PE-ALD) process, an electroless (e-less) deposition process, or combinations of two or more deposition processes. In some examples, an electroplating process can be utilized to deposit or form at least a portion of the sacrificial layer 120, if a conductive seed layer is initially deposited, adhered, or otherwise formed on the support substrate 102 by a vapor or wet deposition process. Thereafter, electroplating process can be utilized to deposit or form one or more electrically conductive materials or electrically semi-conductive materials of the sacrificial layer 120.

The protective surface or layer 140 can contain one or more layers of one or more dielectric materials, such as an electrically non-conductive or insulative material, which can be completely or substantially non-reactive with the etchant reagent or the electrolyte solution. The protective surface or layer 140 can contain one or more native oxides, silicon oxide, silicon nitride, silicon oxynitride, silica, silicates, amorphous silicon, aluminum oxide, alumina, aluminates, hafnium oxide, titanium oxide, derivatives thereof, or mixtures thereof. The protective surface or layer 140 can have a thickness of about 1,000 Å or greater, such as of about 1,000 Å to about 10,000 Å, about 2,000 Å to about 6,000 Å, or about 3,000 Å to about 5,000 Å, for example, about 4,000 Å.

The protective surface or layer 140 can be deposited or otherwise formed by a vapor deposition process, a high thermal process, a thermal spray process, a steam process, a plasma-oxygenation process, a plasma-nitridation process, a post-nitridation anneal (PNA) process, a decoupled plasma nitridation (DPN), a spin-on coating process, a painting or printing process, a taping or foiling process, as well as other deposition techniques, or combinations of two or more deposition processes. Exemplary vapor deposition processes can include a CVD process, a PE-CVD process, an ALD process, and a PE-ALD process. In other examples, the protective surface or layer 140 can be a tape, a foil, or a plate laminated over the sacrificial layer 120.

The process piece 150 can generally include one or more wafers, substrate, or devices and/or one or more portions of the one or more wafers, substrate, or devices. Exemplary wafers, substrate, or devices and/or portions of wafers, substrate, or devices that can be or contained in the process piece 150 include thin-film electronic devices, flexible thin-film electronics, thin-film displays, thin-film transistor (TFT) circuits, TFT backplanes, sensors (e.g., a X-ray or photo sensor), photovoltaic cells, light emitting diodes (LEDs), organic light emitting diodes (OLEDs), active-matrix OLED (AMOLEDs), liquid crystal displays (LCDs), TFT-LCDs, electronic paper display devices, touch panels, energy storage devices, thin-film batteries, capacitors, thin-film super-capacitors, microelectromechanical system (MEMS) devices, and other devices.

In some embodiments, the process piece 150 can include a uniform, solid material or a uniform composition, such as a wafer. In one example, the process piece 150 can include a silicon wafer or a portion of the silicon wafer that has devices formed or otherwise disposed on one side of the wafer (e.g., front side) and it is desirable to process the other side of the wafer (e.g., backside). Therefore, the front side of the process piece 150 can be adhered to or facing towards the sacrificial layer 120 and the backside of the process piece 150 can be exposed to one or more processes that can include polishing, depositing, etching, patterning, or other manufacturing processes. In another example, the process piece 150 can include a wafer that has a sacrificial layer 120 deposited or otherwise formed on one side of the wafer (e.g., front side) and devices can be formed or otherwise disposed on the same side of the wafer (e.g., front side). The wafer 150 and the sacrificial layer 120 can be adhered to a support substrate 102 by the though the sacrificial layer 120, and the backside of the process piece 150 can be exposed to one or more processes that can include polishing, depositing, etching, patterning, or other manufacturing processes.

The support film 160 can have one layer or multiple layers of at least one material, such as a polymeric material, a non-conductive or electrically insulative inorganic material, a metallic layer with a non-conductive or electrically insulative coating, or mixtures thereof. In some examples, the polymeric material contained within the support film 160 can have one layer or multiple layers of polymers, oligomers, resins, plastics, derivatives thereof, or mixtures thereof. Exemplary polymeric materials include organic polymers and resins, silicone polymers, or mixtures thereof. In one example, the support film 160 can contain polyethylene terephthalate (PET) or derivatives thereof. In another example, the support film 160 can contain a polyimide layer and an adhesive layer, and the polyimide layer can be thermally laminated on the thin-film stack.

In other embodiments, the non-conductive or electrically insulative inorganic material of the support film 160 can contain one layer or multiple layers of metal oxides, metal nitrides, metal oxynitrides, metal silicates, metal silicon oxynitrides, metal aluminates, derivatives thereof, or mixtures thereof. Exemplary non-conductive or electrically insulative inorganic materials can include silicon nitride, silicon oxide, silica, silicates, silicon oxynitride, amorphous silicon, amorphous carbon, aluminum oxide, alumina, aluminates, hafnium oxide, titanium oxide, derivatives thereof, or mixtures thereof. In other examples, the metallic layer with a non-conductive or electrically insulative coating of the support film 160 can contain one layer or multiple layers of a non-conductive or electrically insulative coating disposed on and/or over a metallic layer. The non-conductive or electrically insulative coating can be or can contain the polymeric material, the non-conductive or electrically insulative inorganic material, other dielectric or protective materials, or mixtures thereof. The metallic layer can contain aluminum, copper, molybdenum, cobalt, tungsten, titanium, tantalum, chromium, alloys thereof, or mixtures thereof. In another example, the support film 160 can include or contain an aluminum film and an adhesive layer. The aluminum film can be thermally laminated on the process piece 150.

In some embodiments, the support film 160 can have a thickness of about 0.001 mm to about 5 mm, about 0.025 mm to about 1 mm, or about 0.025 mm to about 0.25 mm. In some exemplary embodiments, the support film 160 can contain a plastic or polymeric material and can have a thickness of about 0.025 mm to about 0.25 mm. For example, the support film 160 can contain a polyethylene terephthalate layer or a polyimide layer with adhesive and can have a thickness of about 1 mil (about 25.4 μm) to about 10 mil (about 254 μm). In other exemplary embodiments, the support film 160 can contain a non-conductive or electrically insulative inorganic material and can have a thickness of about 5,000 Å to about 1 mm, about 1,000 Å to about 10 μm. In other exemplary embodiments, the support film 160 can contain a metallic layer with a non-conductive or electrically insulative coating and/or a metallic layer of a less or non-reactive metal than the sacrificial layer 120. The metallic layer can have a thickness of about 5,000 Å to about 1 mm, or about 1,000 Å to about 10 μm.

In one example, the support film 160 can contain a plastic or polymeric material formed or otherwise deposited by a spin-on process or a lamination process and can have a thickness of about 1 μm to about 250 μm. In another example, the support film 160 can contain a non-conductive or electrically insulative inorganic material, such as silicon nitride, silicon oxide, or amorphous carbon formed or otherwise deposited by a vapor deposition process (e.g., CVD or PVD) and can have a thickness of about 1,000 Å to about 10 μm. In another example, the support film 160 can contain a metallic layer with a non-conductive or electrically insulative coating, formed or otherwise deposited by two or more steps and/or processes. The metallic layer can be formed or otherwise deposited by a vapor deposition process (e.g., CVD or PVD) and can have a thickness of about 1,000

Å to about 25 μm. The non-conductive or electrically insulative coating can be formed or otherwise deposited by a spin-on process or a vapor deposition process and can have a thickness of about 1 μm to about 25 μm.

Figure 7A:
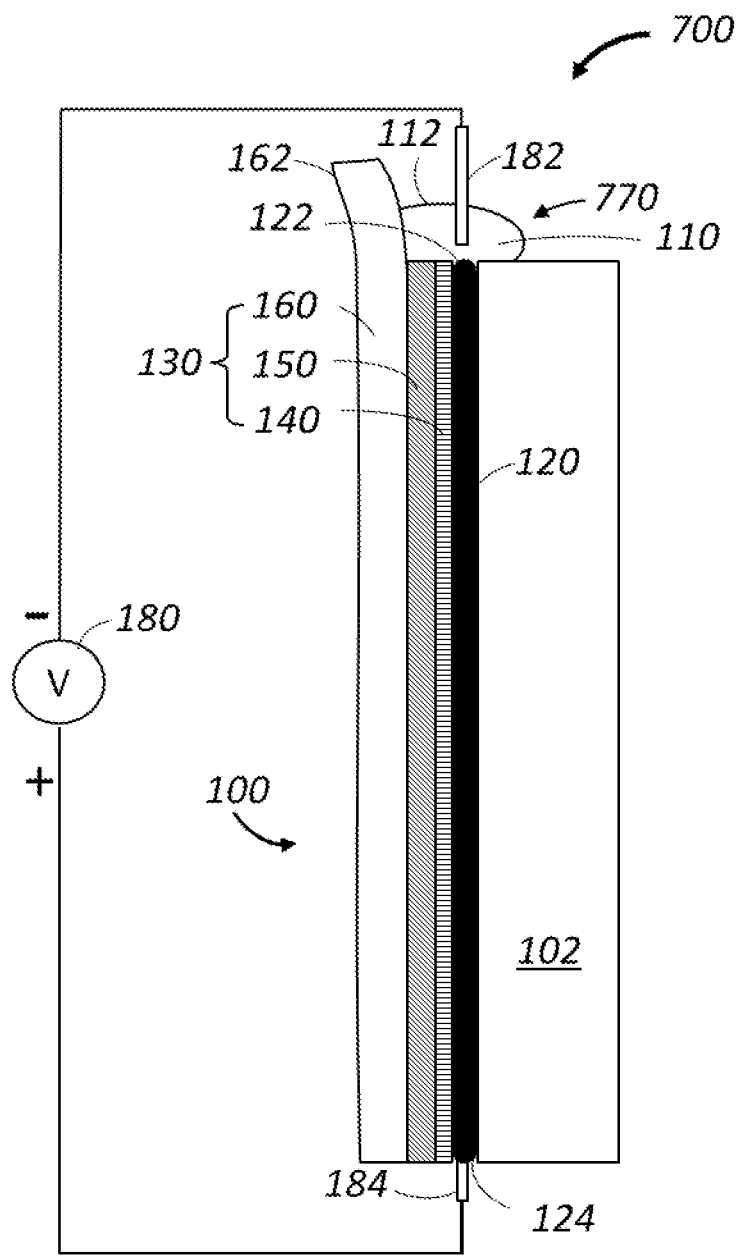
FIGS. 7A and 7B depict another exemplary electrochemical delamination system containing a workpiece disposed in a vertical position, according to one or more embodiments disclosed herein.
Figure 7B:
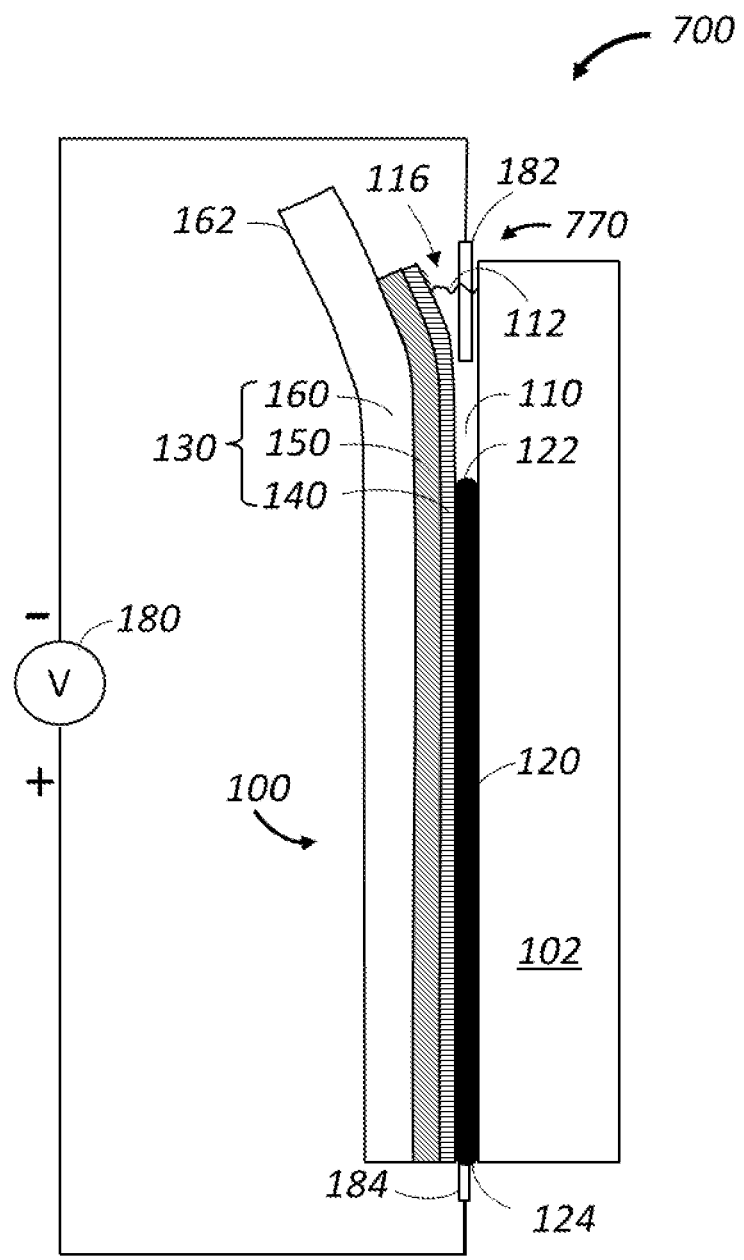

FIGS. 7A and 7B depict another exemplary electrochemical delamination system 700 that can be configured to contain and process the workpiece 100, according to one or more exemplary embodiments. Instead of utilizing an external vat or container to hold the etchant reagent or the electrolyte solution 110, the electrochemical delamination system 700 can have a process area 770 directly on the workpiece 100.

FIG. 7A depicts the workpiece 100, disposed in a vertical position, prior to a delamination process or at an initial or early stage of the delamination process. In some exemplary embodiments, a portion of the support film 160 can have a tab 162 extending in at least one direction, such that the support film 160 can have a longer length and/or a longer width than the support substrate 102, the sacrificial layer 120, the protective surface or layer 140, and/or the process piece 150. The tab 162 can be configured to retain the etchant reagent or the electrolyte solution 110 on one side of at least the support substrate 102 and the sacrificial layer 120 to form the process area 770. The electrode 182 and the first portion 122 of the sacrificial layer 120 can be exposed to the electrolyte solution 110 within the process area 770. The workpiece 100 can be maintained in a vertical position (as depicted in FIGS. 7A and 7B) or may be positioned in an angled position to keep enough of the electrolyte solution 110 contained between the tab 162 and the workpiece 100, especially prior to a delamination process or at the initial or early stage of the delamination process.

FIG. 7B depicts the workpiece 100 at an intermediate stage of the delamination process, such that a segment of the sacrificial layer 120 has been etched or otherwise removed to form the passageway 116 that can contain the electrolyte solution 110, as described in another embodiment. The process area 770 can now be expanded to include the passageway 116 containing the electrolyte solution 110. The first portion 122 of the sacrificial layer 120 can be below the fluid line 112 of the electrolyte solution 110 within the passageway 116 (as depicted in FIG. 7B) so as to maintain electrical communication between the electrode 182 and the sacrificial layer 120 via the electrolyte solution 110 and to maintain physical contact between the first portion 122 of the sacrificial layer 120 and the electrolyte solution 110.

In other embodiments, the electrode 182 can be positioned or otherwise disposed at least partially in the passageway 116 and between the delamination stack 130 and the support substrate 102, as depicted in FIG. 7B. During the delamination process and etching of the sacrificial layer 120, the electrode 182 can be positioned or otherwise disposed further in the passageway 116 staying at or near a desirable distance from the first portion 122 of the sacrificial layer 120.

In some exemplary embodiments, the workpiece 100 can be contained and processed in a vertical position by the electrochemical delamination system 700, as depicted in FIGS. 7A and 7B. In other exemplary embodiments, not shown, the workpiece 100 can also be contained and processed in a horizontal position or an angled position by the electrochemical delamination system 700, as similarly described for electrochemical delamination systems 600 and 200, respectively.

Figure 8:
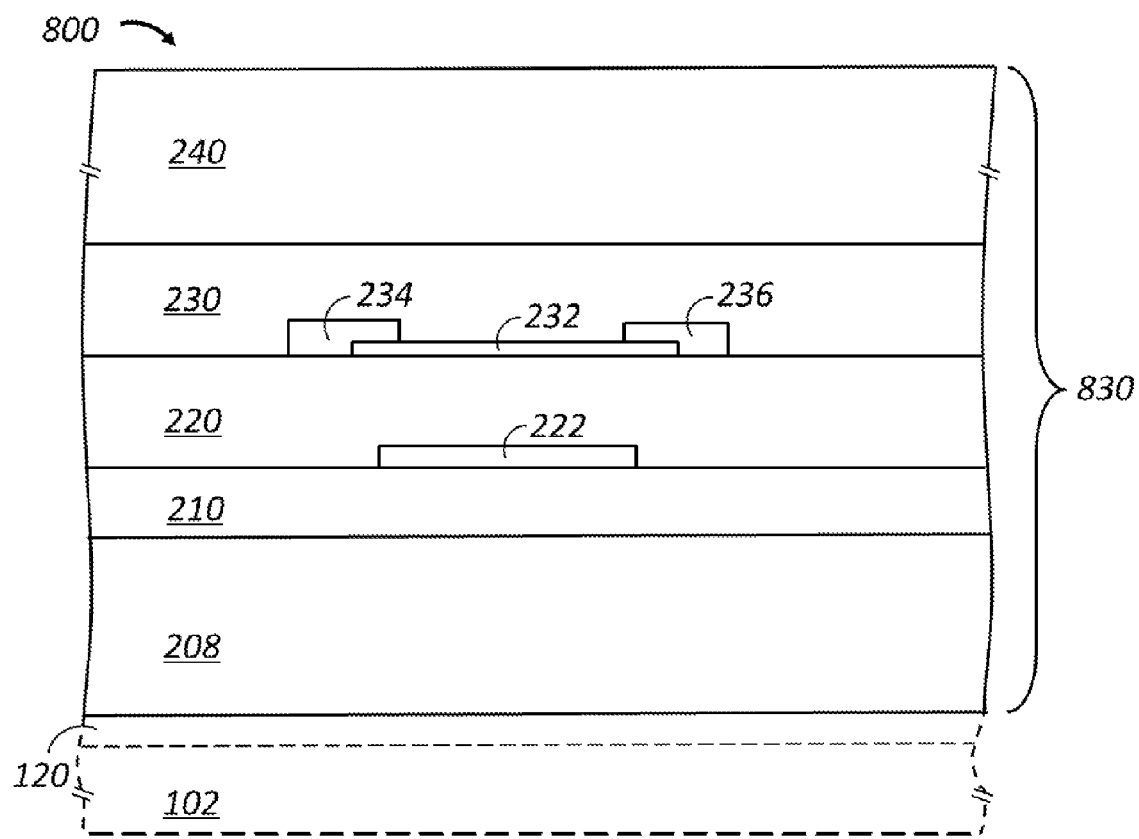
FIG. 8 depicts a workpiece containing an exemplary delamination stack that can include a bottom-gate, thin-film transistor film stack, according to one or more embodiments disclosed herein.
Figure 9:
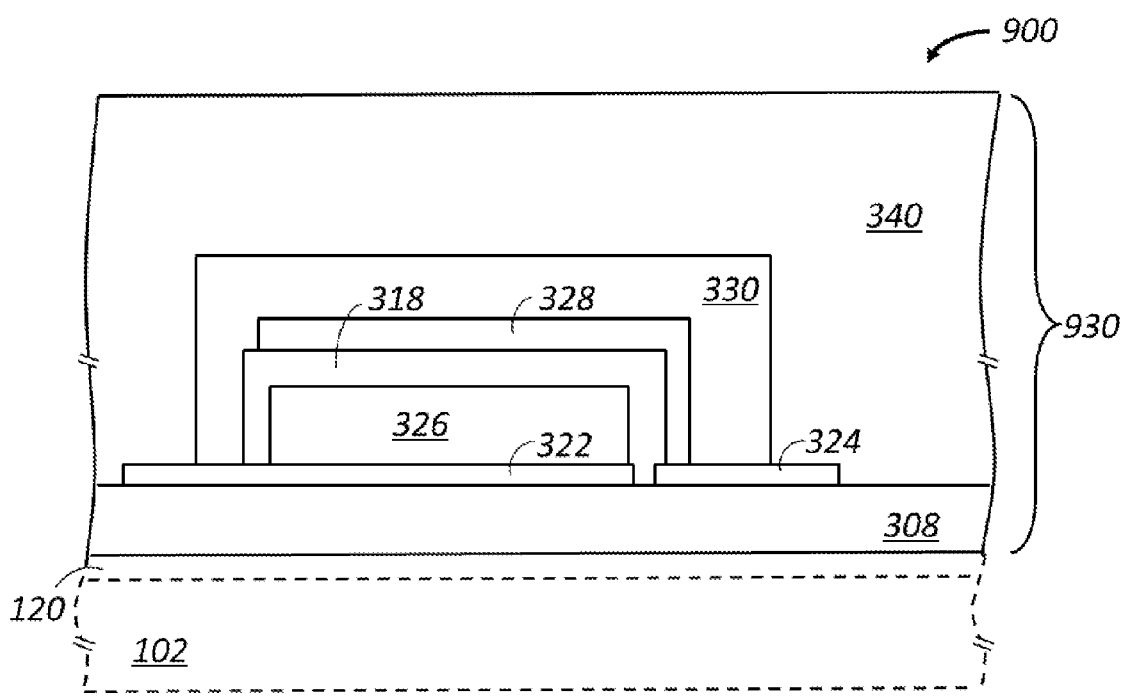
FIG. 9 depicts a workpiece containing another exemplary delamination stack that can include a thin-film, solid-state battery film stack, according to one or more embodiments disclosed herein.

FIG. 8 depicts a workpiece 800 having an exemplary delamination stack 830 that can include a bottom-gate type, thin-film transistor film stack that can be formed into an active-matrix display device, according to one or more exemplary embodiments. The delamination stack 830 can include a supporting layer 208, an optional protection layer 210 disposed on the supporting layer 208, a gate insulating layer 220 containing a gate electrode 222 and disposed on the protection layer 210 (as shown in FIG. 9) or optionally disposed on the supporting layer 208 (not shown). The delamination stack 830 can also include a semiconductor active layer 232 in contact with a source electrode 234 and a drain electrode 236. The semiconductor active layer 232, the source electrode 234, and the drain electrode 236 can be disposed on the gate insulating layer 220 and covered by a passivation layer 230 disposed thereon. A support film 240 may be disposed on the passivation layer 230. In one embodiment, the workpiece 800 can have the delamination stack 830 optionally coupled to the support substrate 102 via the sacrificial layer 120, as illustrated with phantom lines in FIG. 9.

In one exemplary embodiment, the supporting layer 208 can be one or more plastic layers or contain one or more polymeric materials deposited or otherwise formed by a spin-on process or a lamination process and can have a thickness of about 1 μm to about 25 μm. In another embodiment, the supporting layer 208 can contain one or more of a dielectric material or layer, a metallic layer coated or covered by a dielectric material, or a metallic material or layer containing a metal that is less chemically reactive or with a higher redox potential than the sacrificial layer 120 and can have a thickness of about 1,000 Å to about 10 μm. Exemplary dielectric materials and layers can include silicon nitride, silicon oxide, silicon oxynitride, amorphous carbon, or mixtures thereof, and can be deposited or otherwise formed by a CVD process or a PVD process. Exemplary metallic materials and layers can include aluminum, copper, molybdenum, alloys thereof, or mixtures thereof, and can be deposited or otherwise formed by a CVD process or a PVD process.

In one example, the protection layer 210 can be completely or substantially non-reactive to the etchant reagent and the electrolyte solution if exposed during an etching process to form the gate electrode 222. For example, a conductive or metallic layer containing chromium or a chromium alloy can be deposited or otherwise formed on the protection layer 210. After putting a photo-resist to cover the area on the conductive or metallic layer that will be protected to form the gate electrode 222, a dry etch can be conducted to etch or otherwise remove the uncovered conductive or metallic layer and stop at the surface of the protection layer 210 to form the gate electrode 222. In other examples, the protection layer 210 may be omitted if the supporting layer 208 can be completely or substantially non-reactive to the etchant reagent and the electrolyte solution during the etching process.

The gate insulating layer 220 can be deposited or otherwise formed to cover the gate electrode 222. The gate electrode 222 for the thin-film-transistor (TFT) can generally have a thickness of about 500 Å to about 5,000 Å, for example, about 1,500 Å. The gate insulating layer 220 can have a thickness of about 2,000 Å to about 4,000 Å. The semiconductor active layer 232 can have a thickness of about 200 Å to about 1,000 Å. Each of the source electrode 234 and the drain electrode 236 can independently have a thickness of about 500 Å to about 5,000 Å, such as, for example, about 1,500 Å. The passivation layer 230 can contain one or more dielectric layers or materials and have a thickness of about 1,000 Å to about 5,000 Å. The support film 240 can be a film laminated on the electronic device to help delaminate or otherwise separate the delamination stack 830 from the support substrate 102. The support film 240 can be one or more plastic layers or laminates or contain one or more polymeric materials deposited or otherwise formed by a spin-on process or a lamination process and can have a thickness of about 1 mil (about 25.4 µm) to about 10 mil (about 254 µm). In one example, the support film 240 can contain polyethylene terephthalate (PET) or derivatives thereof. In another example, the support film 240 can contain a polyimide layer and an adhesive layer.

FIG. 9 depicts a workpiece 900 containing an exemplary delamination stack 930 that can include a thin-film, solid-state battery film stack, according to one or more exemplary embodiments. In some embodiments, the delamination stack 930 can include a cathode current collector 322 and an anode current collector 324 disposed on a supporting layer 308. The delamination stack 930 can also include a cathode 326 disposed on or over at least the cathode current collector 322 and an electrolyte 318 can be disposed on or over at least the supporting layer 308, the cathode current collector 322, the anode current collector 324, and the cathode 326. The delamination stack 930 can further include an anode 328 can be disposed on or over at least the electrolyte 318 and the anode current collector 324 and a passivation layer 330 disposed on or over at least the electrolyte 318, the cathode current collector 322, the anode current collector 324, and the anode 328. The delamination stack 930 can also include a support film 340 disposed on or over at least the supporting layer 308, the cathode current collector 322, the anode current collector 324, and the passivation layer 330. In one embodiment, the workpiece 900 can have the delamination stack 930 optionally coupled to the support substrate 102 via the sacrificial layer 120, as illustrated with phantom lines in FIG. 9.

In some exemplary embodiments, the supporting layer 308 can be one or more plastic layers or contain one or more polymeric materials deposited or otherwise formed by a spin-on process or a lamination process and can have a thickness of about 1 µm to about 25 µm. In another embodiment, the supporting layer 308 can contain one or more of a dielectric material or layer, a metallic layer coated or covered by a dielectric material, or a metallic material or layer containing a metal that is less chemically reactive or with a higher redox potential than the sacrificial layer 120 and can have a thickness of about 1,000 Å to about 10 µm. Exemplary dielectric materials and layers can include silicon nitride, silicon oxide, silicon oxynitride, amorphous carbon, or mixtures thereof, and can be deposited or otherwise formed by a CVD process or a PVD process. Exemplary metallic materials and layers can include aluminum, copper, molybdenum, alloys thereof, or mixtures thereof, and can be deposited or otherwise formed by a CVD process or a PVD process.

In other exemplary embodiments, the cathode current collector 322 can contain one or more conductive or metallic layers or materials, such as gold, silver, platinum, alloys thereof, or mixtures thereof, and have a thickness of about 1,000 Å to about 5,000 Å. The anode current collector 324 can contain one or more conductive or metallic layers or materials, such as gold, silver, platinum, alloys thereof, or mixtures thereof, and have a thickness of about 1,000 Å to about 5,000 Å. The cathode 326 can contain one or more active layers or materials, such as lithium cobalt oxide (LiCoO$_2$) and have a thickness of about 5,000 Å to about 10 µm. The electrolyte 328 can contain one or more active layers or materials, such as lithium phosphorous oxynitride (LiPON) and have a thickness of about 5,000 Å to about 5 µm. The anode 329 can contain one or more active layers or materials, such as metallic lithium (Li) and/or lithium alloys and have a thickness of about 1,000 Å to about 5,000 Å.

The passivation layer 330 can contain one or more dielectric layers or materials and have a thickness of about 1,000 Å to about 5,000 Å. The support film 340 can be a film laminated on the electronic device to help delaminate or otherwise separate the delamination stack 930 from the support substrate 102. The support film 340 can be one or more plastic layers or laminates or contain one or more polymeric materials deposited or otherwise formed by a spin-on process or a lamination process and can have a thickness of about 1 mil (about 25.4 µm) to about 10 mil (about 254 µm). In one example, the support film 340 can contain polyethylene terephthalate (PET) or derivatives thereof. In another example, the passivation layer 330 and the support film 340 can be combined such as a polyimide film with an adhesion layer.

In one or more exemplary embodiments, the delamination stacks 930 and 1030 can be examples of the delamination stack 130 containing the process piece 150 that can include one or more electronic devices or one or more portions of electronic devices. In some examples, the process piece 150, as disclosed in embodiments herein, can include the bottom-gate type, thin-film transistor film stack of the delamination stack 830, as depicted in FIG. 9. In some examples, the process piece 150, as disclosed in embodiments herein, can include the thin-film, solid-state battery film stack of the delamination stack 930, as depicted in FIG. 9.

Figure 10A:
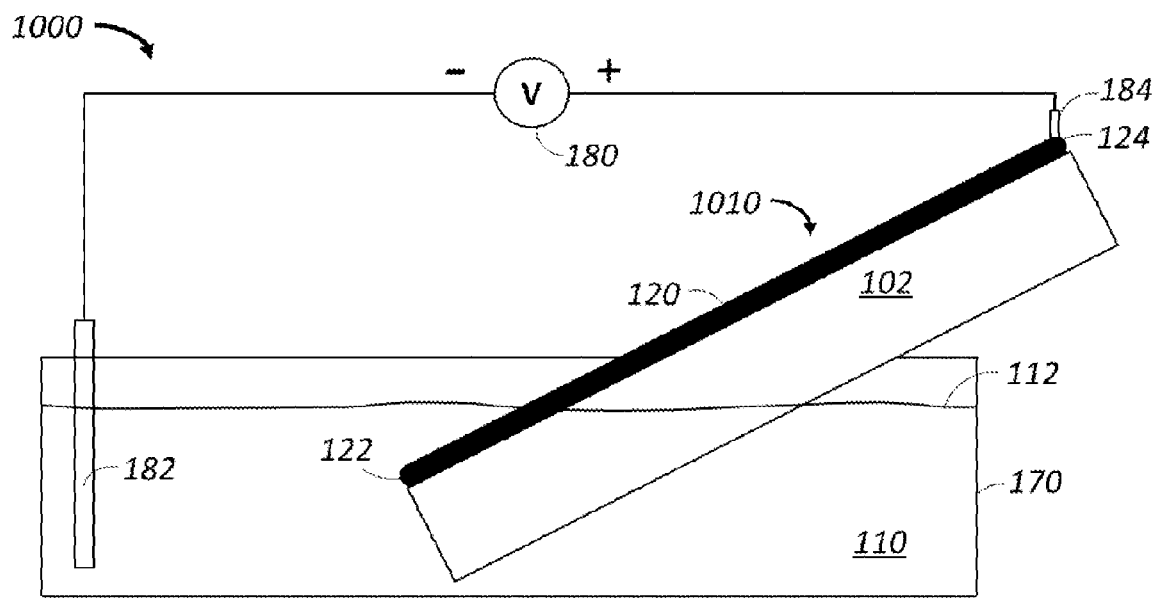
FIGS. 10A-10C depict an exemplary electrochemical system containing a workpiece disposed in an angled position, according to one or more embodiments disclosed herein.
Figure 10B:
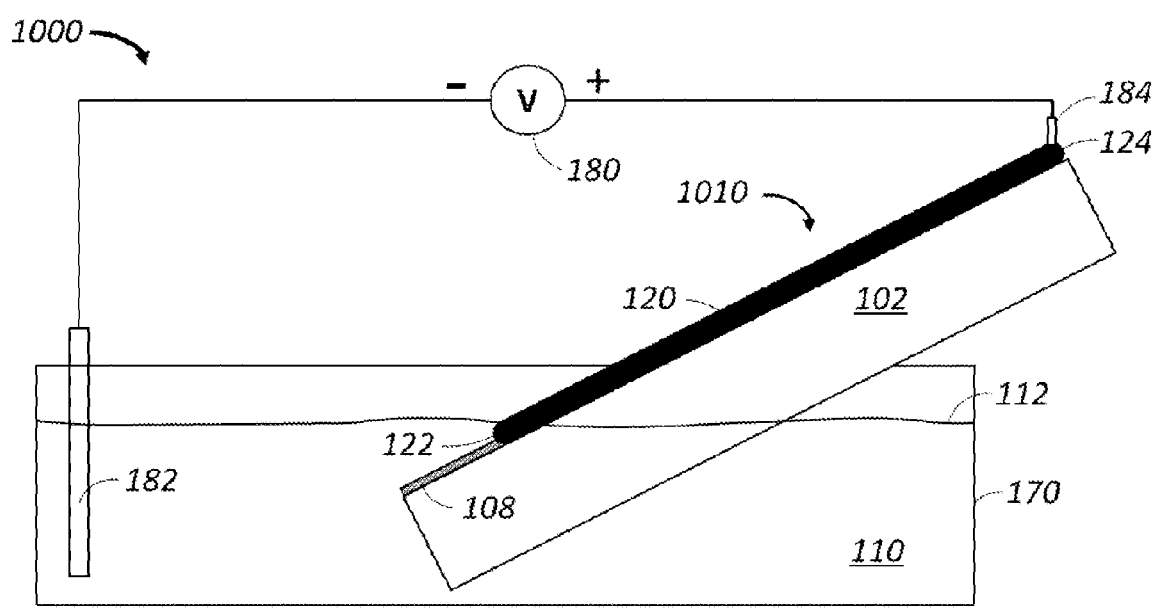
Figure 10C:
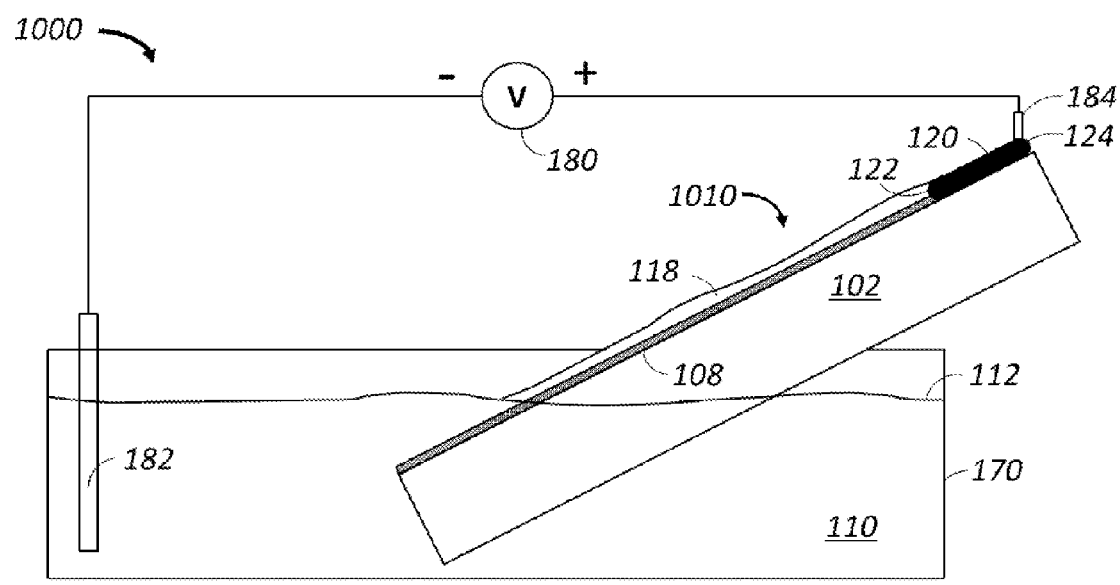

FIGS. 10A-10C depict an exemplary electrochemical system 1000 that can be configured to contain and process a workpiece 1010 that does not have a delamination stack or film, according to one or more exemplary embodiments. The electrochemical system 1000 can be similar to the electrochemical delamination system 200, as depicted in FIGS. 2A and 2B, but the workpiece 1010 lacks a delamination stack or film disposed on the sacrificial layer 120 that can be disposed on the support substrate 102. Instead of delaminating a stack or film, the sacrificial layer 120 can be chemically reacted or converted to form a product layer 108 disposed on the support substrate 102. Also, a portion of the formed product species can be dissolved, suspended, or otherwise contained in the electrolyte solution 110.

In one or more embodiments, the workpiece 1010 can be at least partially exposed to and in electrical communication with the etchant reagent or the electrolyte solution 110 within the electrolyte vat 170. Generally, the first portion 122 of the sacrificial layer 120 can be in physical contact with the electrolyte solution 110, such as below the upper surface or the fluid line 112 of the electrolyte solution 110. The second portion 124 of the sacrificial layer 120 can be maintained free of physical contact with the electrolyte solution 110, such as above the upper surface or the fluid line 112. The electrode 182 can be at least partially, substantially, or completely exposed to and in electrical communication with the electrolyte solution 110 contained within the electrolyte vat 170, and therefore, also in electrical communication with the first portion 122 of the sacrificial layer 120. The contact 184 can be at least partially, substantially, or completely in physical contact and in electrical communication with the second portion 124 of the sacrificial layer 120.

FIG. 10A depicts the workpiece 1010 prior to an electrochemical conversion process or at an initial or early stage of the electrochemical conversion process and the sacrificial layer 120 can be disposed on the support substrate 102 with an upper surface of the sacrificial layer 120 free of a delamination stack or film. In one exemplary embodiment, an electrical current can be applied from the power supply 180 via the contact 184, through the second portion 124 of the sacrificial layer 120, through the sacrificial layer 120, through the first portion 122 of the sacrificial layer 120, through the electrolyte solution 110, through the electrode 182, and back to the power supply 180.

FIG. 10B depicts the workpiece 1010 at an intermediate stage of the electrochemical conversion process, such that a segment of the sacrificial layer 120 has been etched, removed, and/or chemically converted to form the product layer 108 on the upper surface of the support substrate 102. The first portion 122 of the sacrificial layer 120 can be disposed below the fluid line 112 of the electrolyte solution 110 (as depicted in FIG. 10B) such that the electrical communication between the electrode 182 and the sacrificial layer 120 via the electrolyte solution 110 can be maintained without an electro-osmotic flow on the support substrate 102.

FIG. 10C depicts the workpiece 1010 at a latter or advance stage of the electrochemical conversion process, such that a larger segment of the sacrificial layer 120 has been etched, removed, and/or chemically converted to form a larger segment of the product layer 108 on the upper surface of the support substrate 102. The electro-osmotic flow 118 of the electrolyte solution 110 can be formed on the upper surface of the product layer 108 and/or the support substrate 102 by the electrical current flowing between the electrode 182 and the contact 184. The electro-osmotic flow 118 can extend from the surface or the fluid line 112 of the electrolyte solution 110, across the product layer 108 and/or the support substrate 102, to the electrically conductive material or the electrically semiconductive material of the first portion 122 the sacrificial layer 120. At least a portion, if not most or all, of the formed product species at or near the first portion 122 the sacrificial layer 120 can be dissolved, suspended, or otherwise contained in the electro-osmotic flow 118 and displaced into the electrolyte solution 110 within the electrolyte vat 170.

In some exemplary embodiments, the workpiece 1010 can be contained and processed in an angled position by the electrochemical system 1000, as depicted in FIGS. 10A-10C. In other exemplary embodiments, not shown, the workpiece 1010 can also be contained and processed in a horizontal position or a vertical position by the electrochemical system 1000, as similarly described for electrochemical delamination systems 600 and 300, respectively. In other exemplary embodiments, not shown, a plurality of the workpieces 1110 can be contained and processed by the electrochemical system 1000, as similarly described for electrochemical delamination system 400.

In one example, the support substrate 102 of the workpiece 1010 was a glass substrate and the sacrificial layer 120 contained aluminum or an aluminum alloy and had a thickness of about 300 Å and an electrical conductivity of about $1 \times 10^7$ S/m. In another example, the support substrate 102 of the workpiece 1010 was a glass substrate and the sacrificial layer 120 contained zinc oxynitride and had a thickness of about 300 Å and an electrical conductivity of about $1 \times 10^{-2}$ S/m. The workpiece 1010 was exposed to an electrolyte solution 110 containing hydrochloric acid (about 1 vol % HCl). A positive DC voltage of about 30 V was applied from the power supply 180, through the contact 184, through the sacrificial layer 120, through the electrolyte solution 110, through the electrode 182, and back to the power supply 180. The exemplary test was conducted at a temperature of about 25° C. and a relative humidity of about 65% or greater.

Embodiments of the present disclosure further relate to any one or more of the following paragraphs:

1. A method, comprising: exposing at least a portion of a workpiece to an electrolyte solution, wherein the workpiece comprises a sacrificial layer disposed between a delamination stack and a support substrate, the delamination stack comprises a process piece, the support substrate comprises an electrically insulative material, and the sacrificial layer comprises an electrically conductive material or an electrically semiconductive material; applying an electrical current through the sacrificial layer and the electrolyte solution; selectively removing the electrically conductive material or the electrically semiconductive material from the sacrificial layer during an etching process; and separating the delamination stack and the support substrate one from the other.

2. The method of paragraph 1, wherein the etching process further comprises forming an electro-osmotic flow of the electrolyte solution between the delamination stack and the support substrate, wherein the electro-osmotic flow extends from a surface of the electrolyte solution contained within an electrolyte vat to the electrically conductive material or the electrically semiconductive material of the sacrificial layer.

3. The method of paragraph 1 or 2, wherein the etching process further comprises: positioning the support substrate to expose a first portion of the sacrificial layer in physical contact with the electrolyte solution and to maintain a second portion of the sacrificial layer free of physical contact with the electrolyte solution; and forming electrical current between a first electrode and a second electrode, wherein the first electrode is in physical contact with the electrolyte solution or an electrolyte vat containing the electrolyte solution, and the second electrode is in physical contact with the second portion of the sacrificial layer.

4. The method to any one of paragraphs 1 to 3, wherein the first electrode is an anode, the second electrode is a cathode, and the electrical current flows from the cathode, through the second portion of the sacrificial layer, through the first portion of the sacrificial layer, through the electrolyte solution, and to the anode.

5. The method to any one of paragraphs 1 to 3, wherein the electrolyte solution is an aqueous solution comprising one or more acidic reagents, one or more basic reagents, one or more metallic compounds, or any mixture thereof.

6. The method of paragraph 5, wherein the one or more acidic reagents or basic reagents comprise one or more compounds selected from the group consisting of hydrochloric acid, sulfuric acid, nitric acid, phosphoric acid, acetic acid, dihydroxyacetic acid, citric acid, potassium hydroxide, sodium hydroxide, ammonium hydroxide, salts thereof, and any mixture thereof, and the one or more metallic compounds comprise one or more metal cation selected from the group consisting of iron, copper, zinc, aluminum, magnesium, and any mixture thereof.

7. The method to any one of paragraphs 1 to 6, wherein the electrolyte solution comprises one or more anions selected from the group consisting of $Cl^-$, $F^-$, $Br^-$, $O^{2-}$, $CO_3^{2-}$, $HCO_3^-$, $OH^-$, $NO_3^-$, $PO_4^{3-}$, $SO_4^{2-}$, $CH_3COO^-$, $HCOO^-$, $C_2O_4^{2-}$, $CN^-$, and any mixture thereof, and one or more cations selected from the group consisting of $HN_4^+$, $H_3O^+$, $H^+$, and any mixture thereof.

8. The method to any one of paragraphs 1 to 7, wherein separating the delamination stack and the support substrate further comprises: maintaining the support substrate substantially stationary and exerting a force to the delamination stack to separate the delamination stack from the support substrate; maintaining the delamination stack substantially stationary and exerting a force to the support substrate to separate the support substrate from the delamination stack; or exerting forces to the support substrate and the delamination stack to separate one from the other.

9. The method to any one of paragraphs 1 to 9, wherein the sacrificial layer comprises one or more electrically conductive materials or the electrically semiconductive materials selected from the group consisting of aluminum, nickel, copper, molybdenum, chromium, zinc, zinc oxide, zinc nitride, zinc oxynitride, alloys thereof, and any mixture thereof.

10. The method of paragraph 9, wherein the sacrificial layer has a thickness of about 50 Å to about 2,000 Å.

11. The method to any one of paragraphs 1 to 10, wherein the electrically insulative material contained in the support substrate comprises one or more materials selected from the group consisting of silicon, silicon oxide, silica, silicon oxynitride, silicon nitride, aluminum oxide, alumina, acrylic materials, poly(methyl methacrylate) (PMMA), polycarbonate, and any mixture thereof.

12. The method to any one of paragraphs 1 to 11, wherein the support substrate comprises one or more of glass materials, ceramic materials, plastic or polymeric materials, adhesives, a semiconductive body or substrate at least partially coated with the electrically insulative material, or a conductive body or substrate at least partially coated with the electrically insulative material.

13. The method to any one of paragraphs 1 to 12, wherein the delamination stack further comprises a protective surface or layer disposed between the sacrificial layer and the process piece, wherein the protective surface or layer is an electrically insulative surface on the process piece or an electrically insulative protective layer disposed on the process piece or the sacrificial layer.

14. The method to any one of paragraphs 1 to 13, wherein the delamination stack further comprises a support film coupled to the process piece, and the process piece is disposed between the support film and the sacrificial layer.

15. The method of paragraph 14, wherein the support film comprises one or more of plastic or polymeric materials, adhesives, a metallic layer, a conductive body or substrate at least partially coated with an electrically insulative material, or a semiconductive body or substrate at least partially coated with an electrically insulative material.

16. The method to any one of paragraphs 1 to 15, further comprising: forming or adhering the sacrificial layer on the support substrate, and then forming or adhering at least a portion of the process piece on the sacrificial layer.

17. The method to any one of paragraphs 1 to 16, further comprising: forming or adhering the sacrificial layer on at least a portion of the process piece, and then forming or adhering the support substrate on the sacrificial layer.

18. The method to any one of paragraphs 1 to 17, further comprising electrochemically oxidizing the electrically conductive material or the electrically semiconductive material with the electrical current to form product species in the electrolyte solution during the etching process.

19. The method to any one of paragraphs 1 to 18, wherein the process piece comprises one or more devices or one or more portions of the one or more devices selected from the group consisting of a thin-film electronic device, a thin-film display, a thin-film transistor (TFT) circuit, a TFT backplane, a sensor, a photovoltaic cell, a light emitting diode (LED), an organic light emitting diode (OLED), a liquid crystal display (LCD), an electronic paper display device, a touch panel, an energy storage device, a thin-film battery, a capacitor, a thin-film supercapacitor, a microelectromechanical system (MEMS) device, a patterned wafer, a semiconductive wafer, a conductive wafer, a glass substrate, and a ceramic substrate.

20. An electrochemical delamination system, comprising: a power supply; a first electrode in electrical communication with the power supply; a second electrode in electrical communication with the power supply; an electrolyte vat comprising an electrolyte solution, wherein the first electrode is at least partially exposed to and in electrical communication with the electrolyte solution or the electrolyte vat; and a workpiece at least partially exposed to and in electrical communication with the electrolyte solution, wherein the workpiece comprises: a support substrate comprising an electrically insulative material; a delamination stack comprising a process piece; and a sacrificial layer disposed between the support substrate and the delamination stack, wherein the sacrificial layer comprises an electrically conductive material or an electrically semiconductive material, and the second electrode is in physical contact and electrical communication with the sacrificial layer.

21. A workpiece, comprising: a support substrate comprising an electrically insulative material; a sacrificial layer disposed on the support substrate, wherein the sacrificial layer comprises an electrically conductive material or an electrically semiconductive material; and a delamination stack disposed on the sacrificial layer, wherein the delamination stack further comprises: protective surface or layer disposed on the sacrificial layer, wherein the protective surface or layer comprises an electrically insulative material; a process piece disposed on the electrically insulative protective layer; and a support film disposed on the process piece.

It is to be understood that the present disclosure describes several exemplary embodiments for implementing different features, structures, or functions of the invention. Exemplary embodiments of components, arrangements, and configurations are described herein to simplify the present disclosure; however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the present disclosure can include embodiments in which the first and second features are formed in direct contact, and may also include embodiments in which additional features can be formed interposing the first and second features, such that the first and second features may not be in direct contact. Finally, the exemplary embodiments described herein can be combined in any combination of ways, i.e., any element from one exemplary embodiment can be used in any other exemplary embodiment without departing from the scope of the disclosure.

Additionally, certain terms are used throughout the present disclosure and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Further, in the present disclosure and in the claims, the terms "including", "containing", and "comprising" are used in an open-ended fashion, and thus should be interpreted to mean "including, but not limited to". All numerical values in this disclosure can be exact or approximate values unless otherwise specifically stated. Accordingly, various embodiments of the present disclosure may deviate from the numbers, values, and ranges disclosed herein without departing from the intended scope. Furthermore, as it is used in the claims or specification, the term "or" is intended to encompass both exclusive and inclusive cases, i.e., "A or B" is intended to be synonymous with "at least one of A and B", unless otherwise expressly specified herein.

The foregoing has outlined features of several embodiments so that those skilled in the art can better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The invention claimed is:

1. A method, comprising:
   exposing at least a portion of a workpiece to an electrolyte solution, wherein the workpiece comprises a sacrificial layer disposed between a delamination stack and a support substrate, the delamination stack comprises a process piece, the support substrate comprises an electrically insulative material, and the sacrificial layer comprises an electrically conductive material or an electrically semiconductive material;
   applying an electrical current through the sacrificial layer and the electrolyte solution;
   selectively removing the electrically conductive material or the electrically semiconductive material from the sacrificial layer during an etching process, wherein the etching process comprises forming an electro-osmotic flow of the electrolyte solution between the delamination stack and the support substrate, wherein the electro-osmotic flow extends from a surface of the electrolyte solution contained within an electrolyte vat to the electrically conductive material or the electrically semiconductive material of the sacrificial layer; and
   separating the delamination stack and the support substrate one from the other.

2. A method, comprising:
   exposing at least a portion of a workpiece to an electrolyte solution, wherein the workpiece comprises a sacrificial layer disposed between a delamination stack and a support substrate, the delamination stack comprises a process piece, the support substrate comprises an electrically insulative material, and the sacrificial layer comprises an electrically conductive material or an electrically semiconductive material;
   applying an electrical current through the sacrificial layer and the electrolyte solution;
   selectively removing the electrically conductive material or the electrically semiconductive material from the sacrificial layer during an etching process, wherein the etching process comprises:
      positioning the support substrate to expose a first portion of the sacrificial layer in physical contact with the electrolyte solution and to maintain a second portion of the sacrificial layer free of physical contact with the electrolyte solution; and
      forming electrical current between a first electrode and a second electrode, wherein the first electrode is in physical contact with the electrolyte solution or an electrolyte vat containing the electrolyte solution, and the second electrode is in physical contact with the second portion of the sacrificial layer; and
   separating the delamination stack and the support substrate one from the other.

3. The method of claim 2, wherein the first electrode is an anode, the second electrode is a cathode, and the electrical current flows from the cathode, through the second portion of the sacrificial layer, through the first portion of the sacrificial layer, through the electrolyte solution, and to the anode.

4. The method of claim 1, wherein the electrolyte solution is an aqueous solution comprising one or more acidic reagents, one or more basic reagents, one or more metallic compounds, or any mixture thereof.

5. The method of claim 4, wherein the one or more acidic reagents or basic reagents comprise one or more compounds selected from the group consisting of hydrochloric acid, sulfuric acid, nitric acid, phosphoric acid, acetic acid, dihydroxyacetic acid, citric acid, potassium hydroxide, sodium hydroxide, ammonium hydroxide, salts thereof, and any mixture thereof, and the one or more metallic compounds comprise one or more metal cation selected from the group consisting of iron, copper, zinc, aluminum, magnesium, and any mixture thereof.

6. The method of claim 1, wherein the electrolyte solution comprises one or more anions selected from the group consisting of $Cl^-$, $F^-$, $Br$, $O^{2-}$, $CO_3^{2-}$, $HCO_3^-$, $OH^-$, $NO_3^-$, $PO_4^{3-}$, $SO_4^{2-}$, $CH_3COO^-$, $HCOO^-$, $C_2O_4^{2-}$, $CN^-$, or any mixture thereof, and one or more cations selected from the group consisting of $HN_4^+$, $H_3O^+$, $H^+$, or any mixture thereof.

7. The method of claim 1, wherein separating the delamination stack and the support substrate further comprises:
   maintaining the support substrate substantially stationary and exerting a force to the delamination stack to separate the delamination stack from the support substrate;
   maintaining the delamination stack substantially stationary and exerting a force to the support substrate to separate the support substrate from the delamination stack; or
   exerting forces to the support substrate and the delamination stack to separate one from the other.

8. The method of claim 1, wherein the sacrificial layer comprises one or more electrically conductive materials or the electrically semiconductive materials selected from the group consisting of aluminum, nickel, copper, molybdenum, chromium, zinc, zinc oxide, zinc nitride, zinc oxynitride, alloys thereof, and any mixture thereof.

9. The method of claim 8, wherein the sacrificial layer has a thickness of about 50 Å to about 2,000 Å.

10. The method of claim 1, wherein the electrically insulative material contained in the support substrate comprises one or more materials selected from the group consisting of silicon, silicon oxide, silica, silicon oxynitride, silicon nitride, aluminum oxide, alumina, acrylic materials, poly(methyl methacrylate) (PMMA), polycarbonate, and any mixture thereof.

11. The method of claim 1, wherein the support substrate comprises one or more of glass materials, ceramic materials, plastic or polymeric materials, adhesives, a semiconductive body or substrate at least partially coated with the electrically insulative material, or a conductive body or substrate at least partially coated with the electrically insulative material.

12. The method of claim 1, wherein the delamination stack further comprises a protective surface or layer disposed between the sacrificial layer and the process piece, wherein the protective surface or layer is an electrically insulative surface on the process piece or an electrically insulative protective layer disposed on the process piece or the sacrificial layer.

13. The method of claim 1, wherein the delamination stack further comprises a support film coupled to the process piece, and the process piece is disposed between the support film and the sacrificial layer.

14. The method of claim 13, wherein the support film comprises one or more of plastic or polymeric materials, adhesives, a metallic layer, a conductive body or substrate at least partially coated with an electrically insulative material, or a semiconductive body or substrate at least partially coated with an electrically insulative material.

15. The method of claim 1, further comprising:
forming or adhering the sacrificial layer on the support substrate, and then
forming or adhering at least a portion of the process piece on the sacrificial layer.

16. The method of claim 1, further comprising:
forming or adhering the sacrificial layer on at least a portion of the process piece, and then
forming or adhering the support substrate on the sacrificial layer.

17. The method of claim 1, further comprising electrochemically oxidizing the electrically conductive material or the electrically semiconductive material with the electrical current to form product species in the electrolyte solution during the etching process.

18. The method of claim 1, wherein the process piece comprises one or more devices or one or more portions of the one or more devices selected from the group consisting of a thin-film electronic device, a thin-film display, a thin-film transistor (TFT) circuit, a TFT backplane, a sensor, a photovoltaic cell, a light emitting diode (LED), an organic light emitting diode (OLED), a liquid crystal display (LCD), an electronic paper display device, a touch panel, an energy storage device, a thin-film battery, a capacitor, a thin-film supercapacitor, a microelectromechanical system (MEMS) device, a patterned wafer, a semiconductive wafer, a conductive wafer, a glass substrate, and a ceramic substrate.

* * * * *